(12) United States Patent
Hsu

(10) Patent No.: US 11,557,576 B2
(45) Date of Patent: Jan. 17, 2023

(54) METHOD FOR FABRICATING SEMICONDUCTOR DEVICE WITH ACTIVE INTERPOSER

(71) Applicant: NANYA TECHNOLOGY CORPORATION, New Taipei (TW)

(72) Inventor: Ping Hsu, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 17/537,972

(22) Filed: Nov. 30, 2021

(65) Prior Publication Data

US 2022/0093575 A1   Mar. 24, 2022

Related U.S. Application Data

(62) Division of application No. 16/889,218, filed on Jun. 1, 2020, now Pat. No. 11,462,519.

(51) Int. Cl.
*H01L 23/495* (2006.01)
*H01L 25/10* (2006.01)
(Continued)

(52) U.S. Cl.
CPC .......... *H01L 25/105* (2013.01); *H01L 23/481* (2013.01); *H01L 23/49827* (2013.01);
(Continued)

(58) Field of Classification Search
None
See application file for complete search history.

(56) References Cited

U.S. PATENT DOCUMENTS

| 6,424,034 B1* | 7/2002 | Ahn | ............... H01L 25/18 |
| | | | 257/723 |
| 8,436,455 B2* | 5/2013 | Eun | ............... H01L 23/49816 |
| | | | 257/E23.177 |

(Continued)

FOREIGN PATENT DOCUMENTS

TW    202018831 A    5/2020

OTHER PUBLICATIONS

Office Action dated Jan. 21, 2022 related to U.S. Appl. No. 16/889,218 wherein this application is a DIV of U.S. Appl. No. 16/889,218.

(Continued)

*Primary Examiner* — Hung K Vu
(74) *Attorney, Agent, or Firm* — Xuan Zhang

(57) ABSTRACT

The present application discloses a method for fabricating a semiconductor device. The semiconductor device includes an active interposer including a programmable unit, a first memory die positioned above the active interposer and including a storage unit, and a first logic die positioned below the active interposer. The active interposer, the first memory die, and the first logic die are electrically coupled. method includes providing an active interposer comprising a programmable unit; providing a first logic die and bonding a first side of the active interposer onto the first logic die; providing a first memory die comprising a storage unit; and bonding the first memory die onto a second side of the active interposer, wherein the second side of the active interposer is parallel to the first side of the active interposer.

15 Claims, 26 Drawing Sheets

(51) Int. Cl.
*H01L 23/498* (2006.01)
*H01L 23/48* (2006.01)
*H01L 25/00* (2006.01)
*H01L 23/00* (2006.01)

(52) U.S. Cl.
CPC .............. *H01L 24/16* (2013.01); *H01L 25/50* (2013.01); *H01L 2224/16225* (2013.01)

(56) References Cited

U.S. PATENT DOCUMENTS

| | | | |
|---|---|---|---|
| 10,937,692 B2* | 3/2021 | Liu | .................... H01L 21/76844 |
| 2012/0028412 A1* | 2/2012 | Jeong | ................ H01L 21/76898 |
| | | | 257/E21.597 |
| 2014/0175667 A1 | 6/2014 | Lee | |
| 2020/0098724 A1 | 3/2020 | Liff et al. | |
| 2020/0118985 A1 | 4/2020 | Chae et al. | |

OTHER PUBLICATIONS

Office Action dated Mar. 31, 2022 related to U.S. Appl. No. 16/889,218 wherein this application is a DIV of U.S. Appl. No. 16/889,218.
Office Action dated May 5, 2022 related to Taiwanese Application No. 110113934.
Summary translation of Office Action dated May 5, 2022 related to Taiwanese Application No. 110113934.

\* cited by examiner

METHOD FOR FABRICATING SEMICONDUCTOR DEVICE WITH ACTIVE INTERPOSER

CROSS-REFERENCE TO RELATED APPLICATION

This application is a divisional application of U.S. Non-Provisional application Ser. No. 16/889,218 filed Jun. 1, 2020, which is incorporated herein by reference in its entirety.

TECHNICAL FIELD

The present disclosure relates to a method for fabricating a semiconductor device, and more particularly, to a method for fabricating a semiconductor device with an active interposer.

DISCUSSION OF THE BACKGROUND

Semiconductor devices are used in a variety of electronic applications, such as personal computers, cellular telephones, digital cameras, and other electronic equipment. The dimensions of semiconductor devices are continuously being scaled down to meet the increasing demand of computing ability. However, a variety of issues arise during the scaling-down process, and such issues are continuously increasing. Therefore, challenges remain in achieving improved quality, yield, performance, and reliability and reduced complexity.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device including an active interposer including a programmable unit, a first memory die positioned above the active interposer and including a storage unit, and a first logic die positioned below the active interposer. The active interposer, the first memory die, and the first logic die are electrically coupled.

In some embodiments, the semiconductor device includes through substrate vias positioned in the active interposer. The active interposer and the first logic die are electrically coupled through the through substrate vias.

In some embodiments, the semiconductor device includes micro-bumps positioned between the active interposer and the first logic die. The micro-bumps and the through substrate vias are electrically coupled and the micro-bumps and the first logic die are electrically coupled.

In some embodiments, the semiconductor device includes through substrate vias positioned in the first memory die. The active interposer and the first memory die are electrically coupled through the through substrate vias.

In some embodiments, the semiconductor device includes micro-bumps positioned between the active interposer and the first memory die. The micro-bumps and the through substrate vias are electrically coupled and the micro-bumps and the active interposer are electrically coupled.

In some embodiments, a width of a top surface of each of the through substrate vias is between about 1 μm and about 22 μm.

In some embodiments, a depth of each of the through substrate vias is between about 20 μm and about 160 μm.

In some embodiments, an aspect ratio of each of the through substrate vias is between about 1:2 and about 1:35.

In some embodiments, each of the through substrate vias includes a filler layer positioned in the first memory die and an insulating layer surrounding the filler layer. The filler layer is formed of polysilicon, tungsten, copper, carbon nanotube, or solder alloy. The insulating layer is formed of silicon oxide, silicon nitride, silicon oxynitride, tetra-ethyl ortho-silicate, parylene, epoxy, or poly(p-xylene).

In some embodiments, the semiconductor device includes a barrier layer positioned between the insulating layer and the filler layer. The barrier layer is formed of tantalum, tantalum nitride, titanium, titanium nitride, rhenium, nickel boride, or tantalum nitride/tantalum bilayer.

In some embodiments, the semiconductor device includes an adhesion layer positioned between the insulating layer and the filler layer. The adhesion layer is formed of titanium, tantalum, titanium tungsten, or manganese nitride.

In some embodiments, the semiconductor device includes a seed layer positioned between the insulating layer and the filler layer. The seed layer has a thickness between about 10 nm and about 40 nm.

In some embodiments, the semiconductor device includes a redistribution layer positioned between the active interposer and the first memory die. The active interposer and the first memory die are electrically coupled through the redistribution layer.

In some embodiments, the semiconductor device includes micro-pillars positioned between the active interposer and the first memory die. The active interposer and the first memory die are electrically coupled through the micro-pillars.

In some embodiments, the semiconductor device includes micro-pillars positioned between the active interposer and the micro-bumps. The active interposer and the micro-pillars are electrically coupled and the micro-pillars connect the micro-bumps.

In some embodiments, the semiconductor device includes a second memory die positioned above the first memory die. The first memory die and the second memory die are electrically coupled.

In some embodiments, the semiconductor device includes a third memory die positioned above the active interposer and positioned adjacent to the first memory die. The third memory die and the active interposer are electrically coupled.

Another aspect of the present disclosure provides a method for fabricating a semiconductor device including providing an active interposer including a programmable unit, providing a first logic die and bonding a first side of the active interposer onto the first logic die, providing a first memory die including a storage unit, and, bonding the first memory die onto a second side of the active interposer. The second side of the active interposer is parallel to the first side of the active interposer.

In some embodiments, the method for fabricating the semiconductor device includes a step of forming micro-pillars on the second side of the active interposer. The first memory die and the active interposer are bonded through the micro-pillars.

In some embodiments, the method for fabricating the semiconductor device includes a step of forming micro-bumps on the first side of the active interposer. The active interposer and the first logic die are bonded through the micro-bumps.

Due to the design of the semiconductor device of the present disclosure, the first memory die may only include the plurality of storage units. Therefore, the fabrication of the first memory die may be simplified. As a result, the cost of fabrication of the semiconductor device may be reduced. In addition, through substrate vias may decrease interconnection length between the active interposer, the first memory die, and the first logic die to improve the performance of the semiconductor device.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
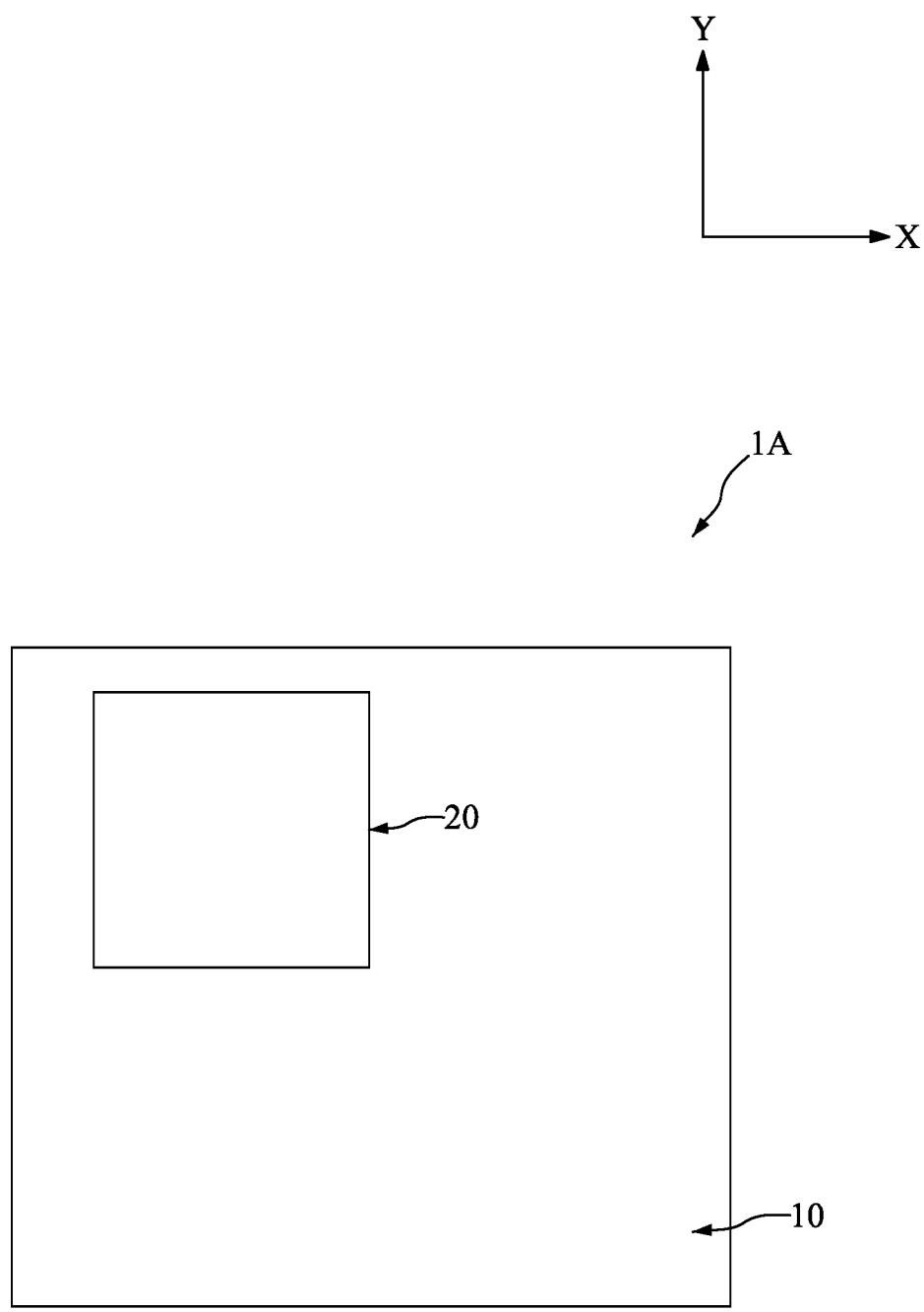
FIG. 1 illustrates, in a schematic top-view diagram, a semiconductor device in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being "connected to" or "coupled to" another element or layer, it can be directly connected to or coupled to another element or layer, or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

It should be noted that, the term "about" modifying the quantity of an ingredient, component, or reactant of the present disclosure employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

In the present disclosure, a semiconductor device generally means a device which can function by utilizing semiconductor characteristics, and an electro-optic device, a light-emitting display device, a semiconductor circuit, and an electronic device are all included in the category of the semiconductor device.

It should be noted that, in the description of the present disclosure, above (or up) corresponds to the direction of the arrow of the direction Z, and below (or down) corresponds to the opposite direction of the arrow of the direction Z.

Figure 2:
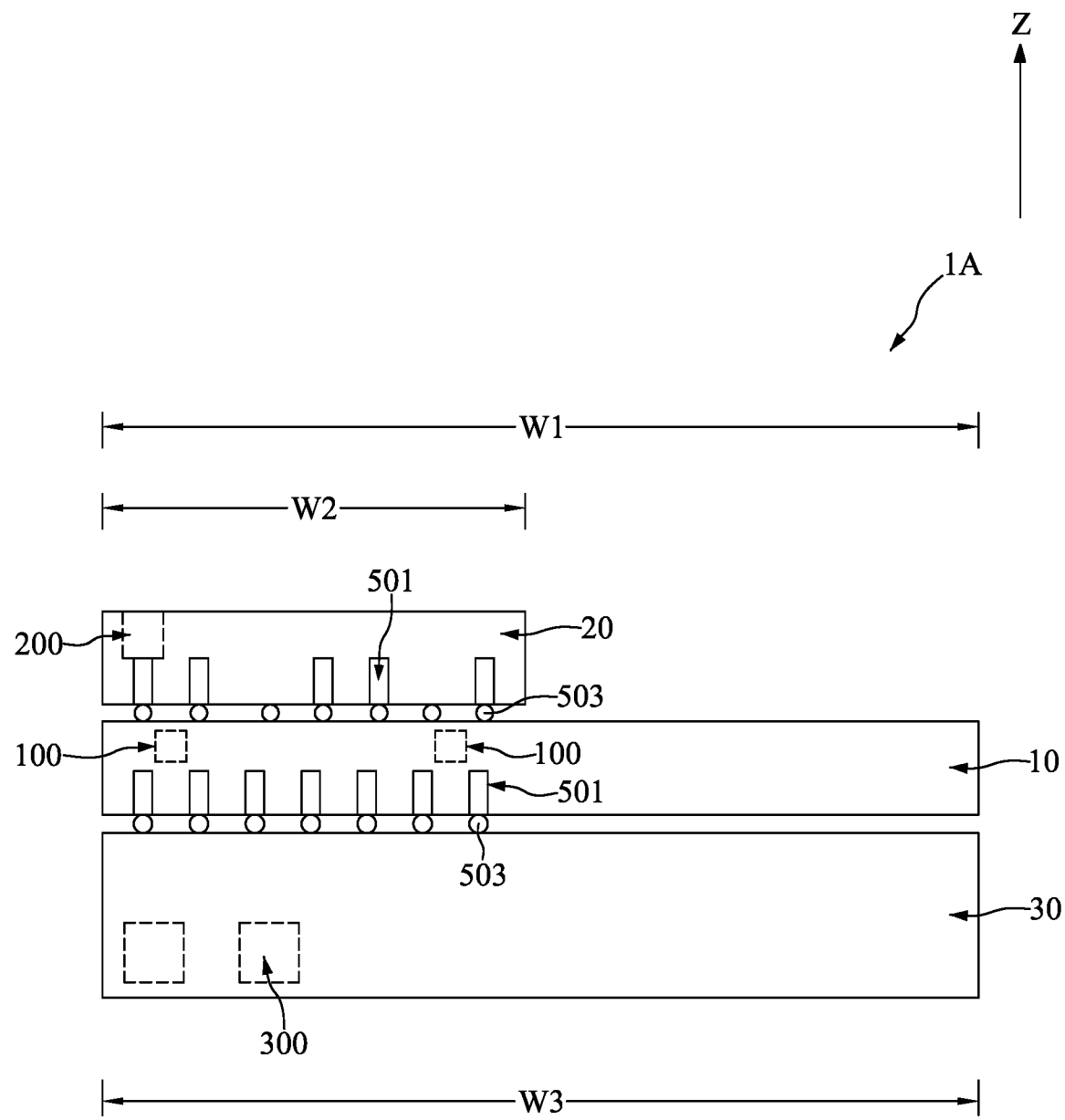
FIG. 2 illustrates, in a schematic cross-sectional view diagram, the semiconductor device in accordance with one embodiment of the present disclosure.
Figure 3:
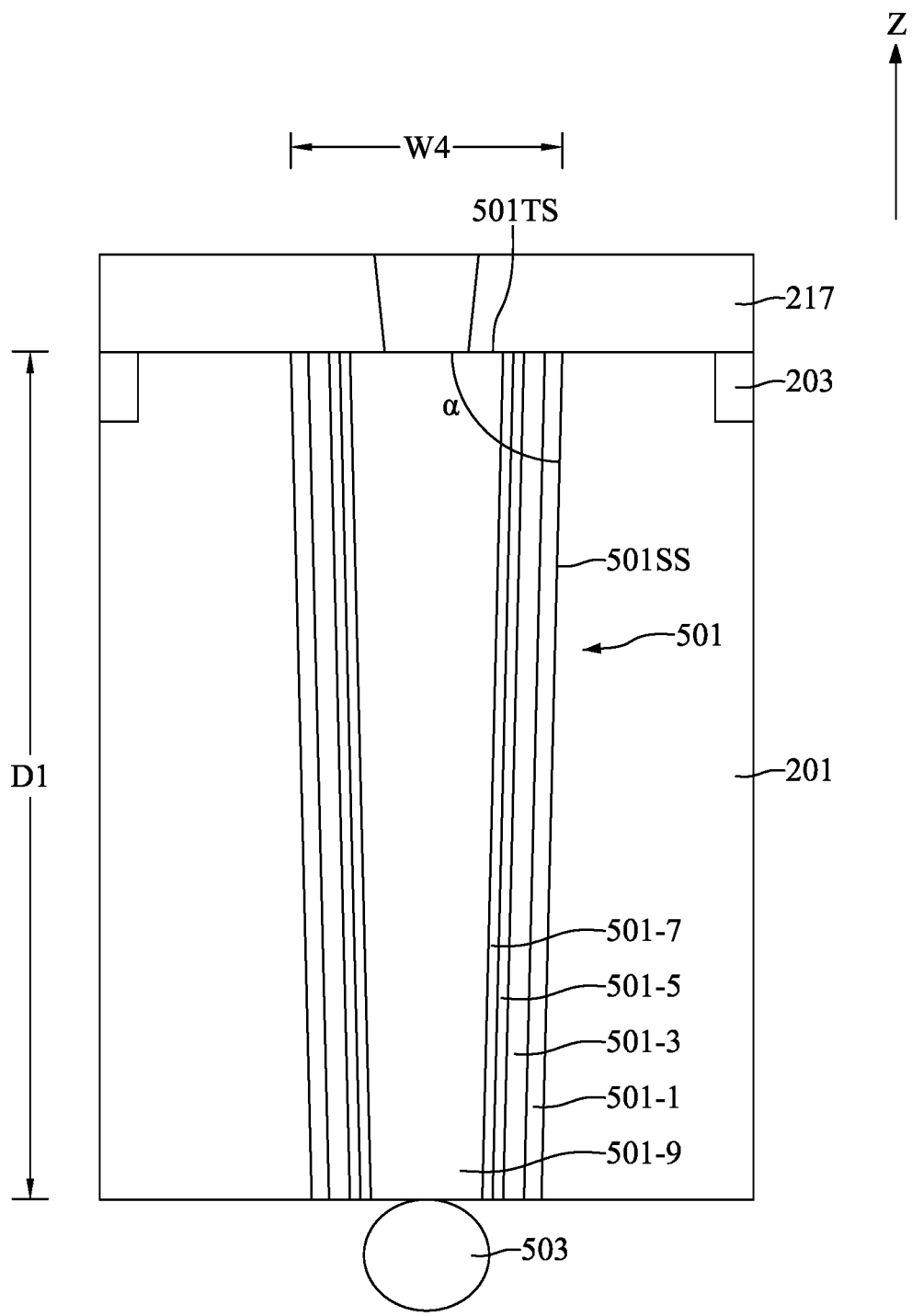
FIG. 3 illustrates, in a schematic cross-sectional view diagram, a through substrate via of the semiconductor device in accordance with one embodiment of the present disclosure.
Figure 4:
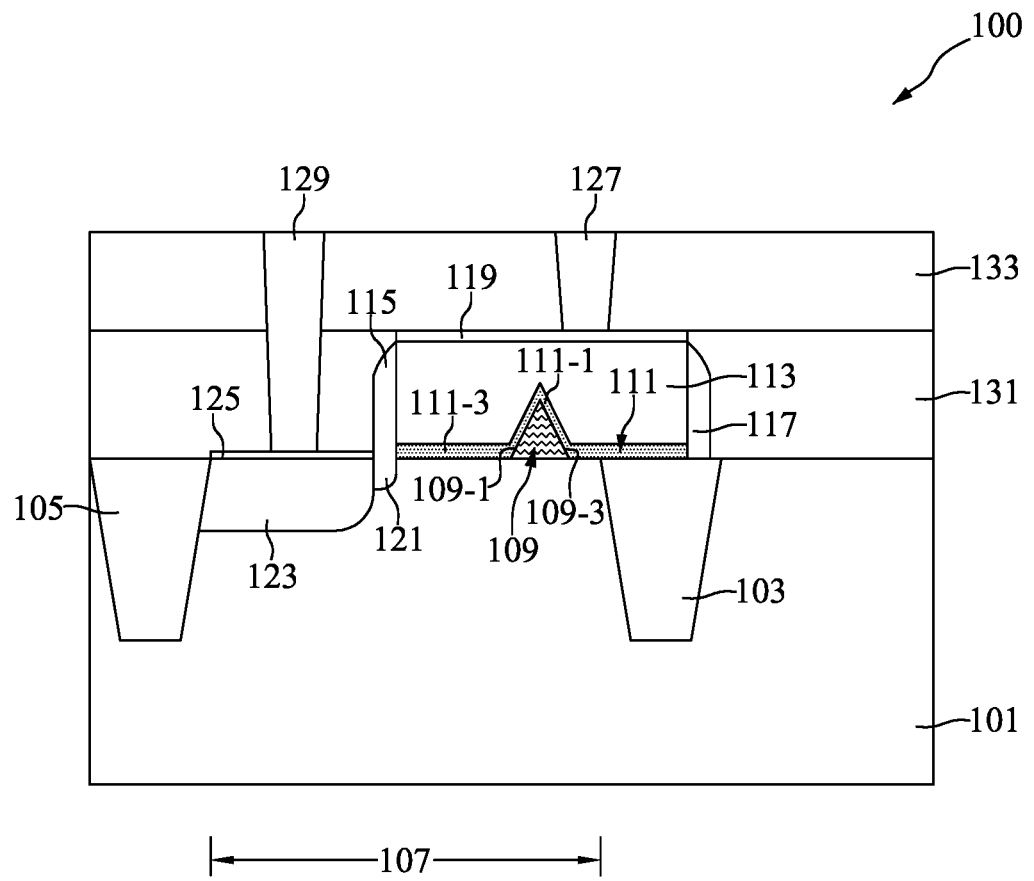
FIG. 4 illustrates, in a schematic cross-sectional view diagram, a programmable unit of the semiconductor device in accordance with one embodiment of the present disclosure.
Figure 5:
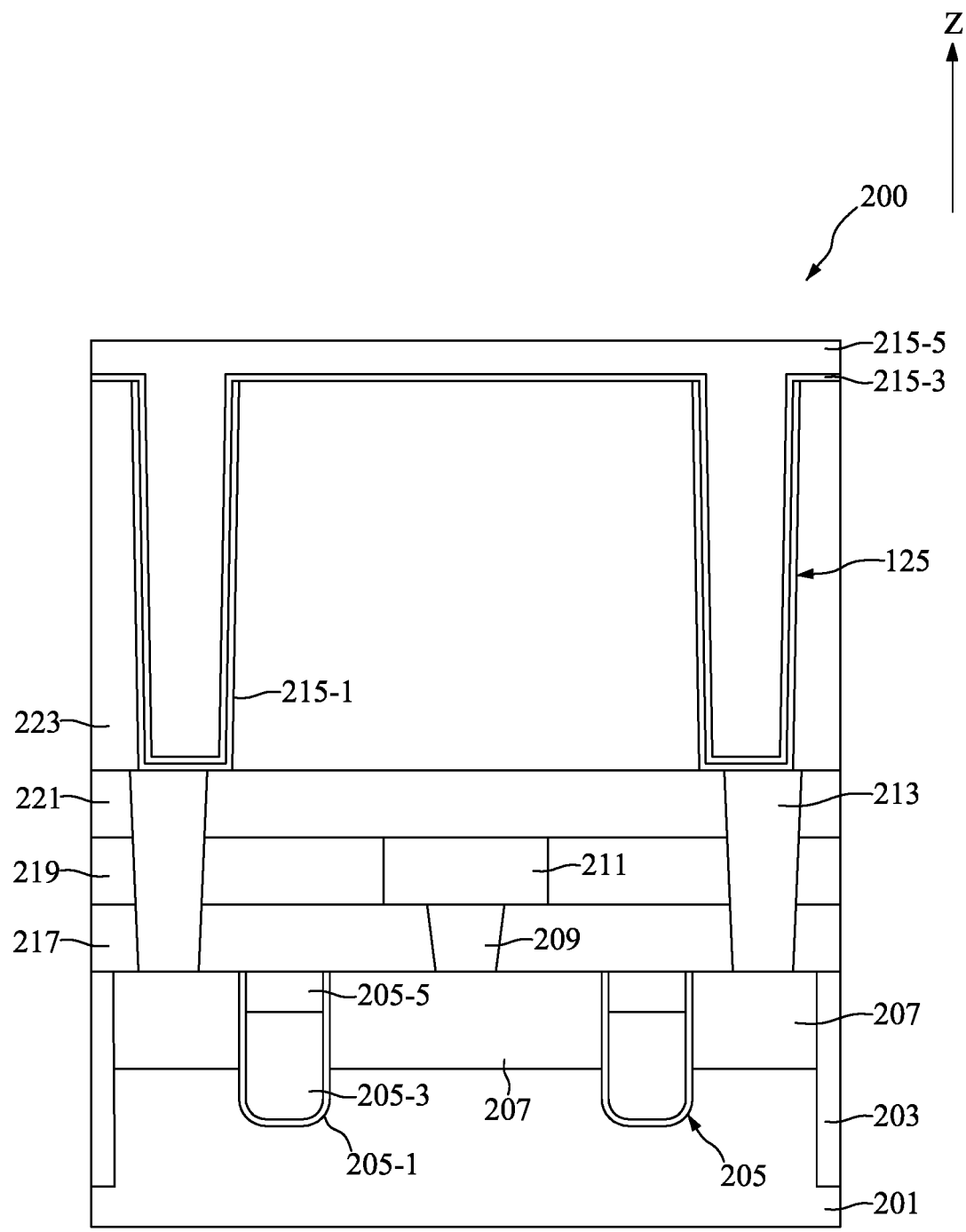
FIG. 5 illustrates, in a schematic cross-sectional view diagram, a storage unit of the semiconductor device in accordance with one embodiment of the present disclosure.

FIG. 1 illustrates, in a schematic top-view diagram, a semiconductor device 1A in accordance with one embodiment of the present disclosure. FIG. 2 illustrates, in a schematic cross-sectional view diagram, the semiconductor device 1A in accordance with one embodiment of the present disclosure. FIG. 3 illustrates, in a schematic cross-sectional view diagram, a through substrate via 501 of the semiconductor device 1A in accordance with one embodiment of the present disclosure. FIG. 4 illustrates, in a schematic cross-sectional view diagram, a programmable unit 100 of the semiconductor device 1A in accordance with one embodiment of the present disclosure. FIG. 5 illustrates, in a schematic cross-sectional view diagram, a storage unit 200 of the semiconductor device 1A in accordance with one embodiment of the present disclosure.

With reference to FIGS. 1 and 2, the semiconductor device 1A may include an active interposer 10, a first memory die 20, a first logic die 30, through substrate vias 501, and micro-bumps 503.

With reference to FIGS. 1 and 2, the active interposer 10, the first memory die 20, and the first logic die 30 may be vertically arranged and electrically coupled to each other. Specifically, the first memory die 20 may be disposed above the active interposer 10. The active interposer 10 may be disposed above the first logic die 30. A width W1 (or dimension) of the active interposer 10 may be greater than a width W2 (or dimension) of the first memory die 20. A width W3 (or dimension) of the first logic die 30 may be equal to or greater than the width W1 of the active interposer 10.

With reference to FIGS. 1 and 2, the first memory die 20 may include a plurality of storage units 200 (only shown one storage unit 200 in FIG. 2 for clarity) arranged in an array pattern in a top-view perspective (not shown in FIG. 1 for clarity). In some embodiments, the storage unit 200 may also include a sense amplifier circuit, a select circuit, an equalizer circuit, or a subword line driver circuit.

It should be note that, in some embodiments, the first memory die 20 may not include programmable circuits, memory controller circuits, decoder circuits, repair circuits, address buffer circuits, clock generator circuits, direct current (DC) generator circuits, address buffer circuits, or input and output (I/O) buffer circuits. The aforementioned circuits may be located in the active interposer 10 or the first logic die 30 and electrically coupled to the first memory die 20. Due to the first memory die 20 may only include the plurality of storage units 200. The fabrication of the first memory die 20 may be simplified. Hence, the cost of fabrication of the first memory die 20 may be reduced.

With reference to FIGS. 1 and 2, the active interposer 10 may include programmable units 100 (only shown two programmable units 100 in FIG. 2 for clarity). The programmable unit 100 may be an e-Fuse, an anti-Fuse, or a redundancy circuit, but is not limited thereto. In some embodiments, the active interposer 10 may also include programmable circuits, memory controller circuits, decoder circuits, repair circuits, address buffer circuits, clock generator circuits, DC generator circuits, address buffer circuits, I/O buffer circuits, system I/O circuits, power management circuits, testing circuits, or monitoring circuits.

With reference to FIGS. 1 and 2, the first logic die 30 may include functional circuits 300 (only shown two functional circuits 300 in FIG. 2 for clarity) to process the digital data for controlling the operation of the semiconductor device 1A. In some embodiments, the first logic die 30 may also include programmable circuits, memory controller circuits, decoder circuits, repair circuits, address buffer circuits, clock generator circuits, DC generator circuits, address buffer circuits, I/O buffer circuits, system I/O circuits, power management circuits, testing circuits, or monitoring circuits.

With reference to FIGS. 1 and 2, the through substrate vias 501 may be respectively correspondingly disposed in the active interposer 10 and the first memory die 20. The bottom surfaces of the through substrate vias 501 disposed in the first memory die 20 may be substantially coplanar with the surface of the first memory die 20 faced the active interposer 10. The bottom surfaces of the through substrate vias 501 disposed in the active interposer 10 may be substantially coplanar with the surface of the active interposer 10 faced the first logic die 30.

With reference to FIGS. 2 and 3, the micro-bumps 503 may be respectively correspondingly disposed between the active interposer 10 and the first memory die 20 and between the active interposer 10 and the first logic die 30. In some embodiments, the micro-bumps 503 may connect the bottom surface of the through substrate vias 501. The active interposer 10, the first memory die 20, and the first logic die 30 may be vertically stacked through the through substrate vias 501 and the micro-bumps 503. The micro-bumps 503 may be formed, for example, copper, nickel, Tin, silver, alloy thereof, or a combination thereof. In some embodiments, each of the micro-bumps 503 may be stacked layer including, from bottom to top, a first layer, a second layer, and a third layer. The first layer may be formed of copper and may have a thickness between about 1 µm and about 3 µm. The second layer may be formed of nickel and may have a thickness between about 1 µm and about 3 µm. The third layer may be formed of tin-silver alloy and may have a thickness between about 3 µm and about 7 µm.

For convenience of description, only one through substrate via 501 is described. With reference to FIGS. 2 and 3, the top surface 501TS of the through substrate via 501 may have a width W4 between about 1 µm and about 22 µm. The through substrate via 501 may have a depth D1 between about 20 µm and about 160 µm. In some embodiments, the through substrate via 501 may have an aspect ratio between about 1:2 and about 1:35. In some embodiments, an angle α between the top surface 501TS of the through substrate via 501 and the side surface 501SS of the through substrate via 501 may be between about 83 degree and about 90 degree.

With reference to FIGS. 2 and 3, the through substrate via 501 may include an insulating layer 501-1, a barrier layer 501-3, an adhesion layer 501-5, a seed layer 501-7, and a filler layer 501-9. The filler layer 501-9 may be disposed in the first memory die 20 (or in the active interposer 10). For example, the filler layer 501-9 may be disposed in a substrate 201 of the first memory die 20. The top surface of the filler layer 501-9 may be substantially coplanar with the top surface of the substrate 201. The bottom surface of the filler layer 501-9 may be substantially coplanar with the bottom surface of the substrate 201. The filler layer 501-9 may be formed of, for example, polysilicon, tungsten, copper, carbon nanotube, or solder alloy.

With reference to FIGS. 2 and 3, the seed layer 501-7 may surround the side surface of the filler layer 501-9. The seed layer 501-7 may be formed of, for example, copper. The seed layer 501-7 may have a thickness between about 10 nm and about 40 nm. The seed layer 501-7 may reduce a resistivity of a through substrate via opening during the formation of the through substrate via 501.

With reference to FIGS. 2 and 3, the adhesion layer 501-5 may surround the side surface of the seed layer 501-7. The adhesion layer 501-5 may be formed of, for example, titanium, tantalum, titanium tungsten, or manganese nitride. The adhesion layer 501-5 may improve an adhesion between the seed layer 501-7 and the barrier layer 501-3.

With reference to FIGS. 2 and 3, the barrier layer 501-3 may surround the side surface of the adhesion layer 501-5. The barrier layer 501-3 may be formed of, for example, tantalum, tantalum nitride, titanium, titanium nitride, rhenium, nickel boride, or tantalum nitride/tantalum bilayer. The barrier layer 501-3 may inhibit diffusion of the conductive materials of the filler layer 501-9 into the insulating layer 501-1 or the substrate 201.

With reference to FIGS. 2 and 3, the insulating layer 501-1 may surround the side surface of the barrier layer 501-3. In some embodiments, the insulating layer 501-1 may be formed of, for example, silicon oxide, silicon nitride, silicon oxynitride, or tetra-ethyl ortho-silicate. The insulating layer 501-1 may have a thickness between about 50 nm and about 200 nm. In some embodiments, the insulating layer 501-1 may be formed of, for example, parylene, epoxy, or poly(p-xylene). The insulating layer 501-1 may have a thickness between about 1 µm and about 5 µm. The insulating layer 501-1 may ensure the through substrate via 501 is electrically isolated in the substrate 201.

The through substrate vias 501 may decrease interconnection length between the active interposer 10, the first memory die 20, and the first logic die 30. As a result, reflection noise, crosstalk noise, simultaneous switching noise, electromagnetic interference, and latency of the semiconductor device 1A may be reduced. Additionally, as the parasitic capacitance is proportional to the interconnection length, the total power consumption in the semiconductor device 1A may be also reduced because of the reduced parasitic capacitance.

With reference to FIGS. 2 and 4, in some embodiments, the programmable unit 100 may be an anti-fuse and may include a substrate 101, a first isolation layer 103, a second isolation layer 105, a first active area 107, a peak portion 109, a gate dielectric layer 111, a gate bottom conductive layer 113, a first gate spacer 115, a second gate spacer 117, a gate top conductive layer 119, a first lightly-doped region 121, a first doped region 123, a first conductive layer 125, a first contact 127, a second contact 129, and insulating layers 131, 133.

With reference to FIGS. 2 and 4, the substrate 101 may be formed of, for example, silicon, germanium, silicon germanium, silicon carbon, silicon germanium carbon, gallium, gallium arsenic, indium arsenic, indium phosphorus or other IV-IV, III-V or II-VI semiconductor materials. The substrate 101 may have a first lattice constant and a crystal orientation <100>. In some embodiments, the substrate 101 may include an organic semiconductor or a layered semiconductor such as silicon/silicon germanium, silicon-on-insulator or silicon germanium-on-insulator. When the substrate 101 is formed of silicon-on-insulator, the substrate 101 may include a top semiconductor layer and a bottom semiconductor layer formed of silicon, and a buried insulating layer which may separate the top semiconductor layer from the bottom semiconductor layer. The buried insulating layer may include, for example, a crystalline or non-crystalline oxide, nitride or any combination thereof.

With reference to FIGS. 2 and 4, the first isolation layer 103 and the second isolation layer 105 may be disposed in the substrate 101. The first isolation layer 103 and the second isolation layer 105 may define the first active area 105 in the substrate 101. The first isolation layer 103 and the second isolation layer 105 may be formed of, for example, an insulating material such as silicon oxide, silicon nitride, silicon oxynitride, silicon nitride oxide, or fluoride-doped silicate.

It should be noted that, in the present disclosure, silicon oxynitride refers to a substance which contains silicon, nitrogen, and oxygen and in which a proportion of oxygen is greater than that of nitrogen. Silicon nitride oxide refers to a substance which contains silicon, oxygen, and nitrogen and in which a proportion of nitrogen is greater than that of oxygen.

With reference to FIGS. 2 and 4, the insulating layer 131 may be disposed on the substrate 101. The insulating layer 133 may be disposed on the insulating layer 131. The insulating layers 131, 133 may be formed of, for example, silicon nitride, silicon oxide, silicon oxynitride, flowable oxide, tonen silazen, undoped silica glass, borosilica glass, phosphosilica glass, borophosphosilica glass, plasma-enhanced tetra-ethyl orthosilicate, fluoride silicate glass, carbon-doped silicon oxide, amorphous fluorinated carbon, organo silicate glass, or a combination thereof, but are not limited thereto. The insulating layers 131, 133 may be formed of different materials but are not limited thereto.

With reference to FIGS. 2 and 4, the peak portion 109 may be disposed on the first active area 107 and in the insulating layer 131. The peak portion 109 may have a cross-sectional profile which is a triangular shape and may include a first faceted plane 109-1 and a second faceted plane 109-3 intersecting to each other. An angle between a top surface of the substrate 101 and the first faceted plane 109-1 may be between about 50 degree and about 60 degree. The first faceted plane 109-1 and the second faceted plane 109-3 may have a crystal orientation <111>. In some embodiments, the peak portion 109 may have cross-sectional profile which is a diamond shape, a pentagonal shape, or a shape having more than five sides. The peak portion 109 may be formed of, for example, silicon, germanium, silicon germanium, silicon carbon, silicon germanium carbon, gallium, gallium arsenic, indium arsenic, indium phosphorus or other IV-IV, III-V or II-VI semiconductor materials.

With reference to FIGS. 2 and 4, the gate dielectric layer 111 may be disposed on the first faceted plane 109-1 and the substrate 101. The gate dielectric layer 111 may be disposed in the insulating layer 131. The gate dielectric layer 111 may include a capping portion 111-1 and two flat portions 111-3. The capping portion 111-1 may be disposed on the first faceted plane 109-1 and the second faceted plane 109-3. The two flat portions 111-3 may be respectively correspondingly connected to two ends of the capping portion 111-1. The two flat portions 111-3 may be disposed on the substrate 101. A portion of one of the two flat portions 111-3 may be disposed on the first isolation layer 103. A thickness of the two flat portions 111-3 may be greater than or equal to a thickness of the capping portion 111-1. In some embodiments, the thickness of the two flat portions 111-3 may be greater than the thickness of the capping portion 111-1.

In some embodiments, the gate dielectric layer 111 may be formed of, for example, silicon oxide. In some embodiments, the gate dielectric layer 111 may be formed of, for example, a high-k dielectric material such as metal oxide, metal nitride, metal silicate, transition metal-oxide, transition metal-nitride, transition metal-silicate, oxynitride of metal, metal aluminate, zirconium silicate, zirconium aluminate, or a combination thereof. Specifically, the gate dielectric layer 111 may be formed of hafnium oxide, hafnium silicon oxide, hafnium silicon oxynitride, hafnium tantalum oxide, hafnium titanium oxide, hafnium zirconium oxide, hafnium lanthanum oxide, lanthanum oxide, zirconium oxide, titanium oxide, tantalum oxide, yttrium oxide, strontium titanium oxide, barium titanium oxide, barium zirconium oxide, lanthanum silicon oxide, aluminum silicon oxide, aluminum oxide, silicon nitride, silicon oxynitride, silicon nitride oxide, or a combination thereof. In some embodiments, the gate dielectric layer 111 may be a multi-layer structure that includes, for example, one layer of silicon oxide and another layer of high-k dielectric material.

With reference to FIGS. 2 and 4, the gate bottom conductive layer 113 may be disposed on the gate dielectric layer 111 and in the insulating layer 131. The gate bottom conductive layer 113 may be formed of, for example, a conductive material such as polycrystalline silicon, polycrystalline silicon germanium, or a combination thereof. In some embodiments, the gate bottom conductive layer 113 may be doped with a dopant such as phosphorus, arsenic, antimony, or boron.

With reference to FIGS. 2 and 4, the first gate spacer 115 and the second gate spacer 117 may be disposed on sidewalls of the gate bottom conductive layer 113 and sidewalls of the gate dielectric layer 111. The first gate spacer 115 and the second gate spacer 117 may be disposed in the insulating layer 131. The first gate spacer 115 may be disposed on the first active area 107. The second gate spacer 117 may be disposed on the first isolation layer 103. The first gate spacer 115 and the second gate spacer 117 may be formed of, for example, silicon oxide, silicon nitride, or the like.

With reference to FIGS. 2 and 4, the gate top conductive layer 119 may be disposed on the gate bottom conductive layer 113 and in the insulating layer 131. The gate top conductive layer 119 may have a thickness between about 2 nm and about 20 nm. The gate top conductive layer 119 may be formed of, for example, titanium silicide, nickel silicide, nickel platinum silicide, tantalum silicide, or cobalt silicide.

With reference to FIGS. 2 and 4, the first lightly-doped region 121 may be disposed below the first gate spacer 115 and in the first active area 107. The first lightly-doped region 121 may be opposite to the first isolation layer 103. In some embodiments, the first lightly-doped region 121 may be doped with a dopant such as phosphorus, arsenic, or antimony and may have a first electrical type. In some embodiments, the first lightly-doped region 121 may be doped with a dopant such as boron and may have a second electrical type.

With reference to FIGS. 2 and 4, the first doped region 123 may be disposed in the first active area 107 and adjacent to the first lightly-doped region 121. The first doped region 123 may be disposed between the first lightly-doped region 121 and the second isolation layer 105. In other words, the first doped region 123 may be opposite to the first isolation layer 103. The first doped region 123 may have a same electrical type as the first lightly-doped region 121 and may be doped with a dopant such as phosphorus, arsenic, antimony, or boron. The first doped region 123 may have a dopant concentration greater than a dopant concentration of the first lightly-doped region 121.

With reference to FIGS. 2 and 4, the first conductive layer 125 may be disposed on the first doped region 123 and in the insulating layer 131. The first conductive layer 125 may have a same thickness as the gate top conductive layer 119 but is not limited thereto. The first conductive layer 125 may be formed of a same material as the gate top conductive layer 119 but is not limited thereto.

With reference to FIGS. 2 and 4, the first contact 127 may be disposed on the gate top conductive layer 119 and in the insulating layer 133. The second contact 129 may be disposed on the first conductive layer 125 and disposed penetrating the insulating layers 131, 133. In some embodiments, the sidewalls of the first contact 127 and the sidewalls of the second contact 129 may have a slanted cross-sectional profile. In some embodiments, a width of the first contact 127 or a width of the second contact 129 may gradually become wider from bottom to top along the direction Z. In some embodiments, the first contact 127 as a whole or the second contact 129 as a whole may have a uniform slope. The first contact 127 and the second contact 129 may be used to apply a programming voltage or current to the programmable unit 100.

During programming of the programmable unit 100, a programming voltage may be provided and applied to the programmable unit 100, a channel region may be formed under the gate dielectric layer 111 and between the first lightly-doped region 121 and the first isolation layer 103. A programming current may flow through the channel region and heat the area around the channel region. During programming of the programmable unit 100, the vertex of the peak portion 109 may be the most vulnerable part because electrical fields concentrate at the sharp profile. Since the vertex of the peak portion 109 may obtain the highest electrical fields, the gate dielectric layer 111 may be broken down to form a rupture point of the gate dielectric layer 111 adjacent to the vertex of the peak portion 109 and a resistance reduction may be induced accordingly. Consequently, the programmable unit 100 is blown and programmed. The position of the rupture point of the gate dielectric layer 111 may be easily limited in the place adjacent to the vertex of the peak portion 109 having the highest electrical fields during programming. As result, the reliability of programming of the programmable unit 100 may be increased.

With reference to FIGS. 2 and 5, the storage unit 200 may include a substrate 201, an isolation layer 203, two word line structures 205, impurity regions 207, a bit line contact 209, a bit line 211, two capacitor contact 213, capacitor structures 215, and insulating layers 217, 219, 221, 223.

With reference to FIGS. 2 and 5, the substrate 201 may be formed of a same material as the substrate 101 but is not limited thereto.

With reference to FIGS. 2 and 5, the isolation layer 203 may be disposed in the substrate 201. The isolation layer 103 may be formed of a same material as the first isolation layer 103 but is not limited thereto.

With reference to FIGS. 2 and 5, the two word line structures 205 may be disposed in the upper portion of the substrate 201. Each of the two word line structures 205 may include a word line dielectric layer 205-1, a word line electrode 205-3, and a word line capping layer 205-5.

With reference to FIGS. 2 and 5, the word line dielectric layer 205-1 may be inwardly disposed in the upper portion of the substrate 201. The word line dielectric layer 205-1 may be formed of a same material as the gate dielectric layer 111 but is not limited thereto. The word line dielectric layer 205-1 may have a thickness between about 0.5 nm and about 10 nm.

With reference to FIGS. 2 and 5, the word line electrode 205-3 may be disposed on the word line dielectric layer 205-1. The word line electrode 205-3 may be formed of a conductive material such as polysilicon, silicon germanium, metal, metal alloy, metal silicide, metal nitride, metal carbide, or a combination including multilayers thereof. When multilayers are present, a diffusion barrier layer (not shown) such as titanium nitride or tantalum nitride may be disposed between each of the multilayers. The metal may be aluminum, copper, tungsten, or cobalt. The metal silicide may be nickel silicide, platinum silicide, titanium silicide, molybdenum silicide, cobalt silicide, tantalum silicide, tungsten silicide, or the like. The word line electrode 205-3 may have a thickness between about 50 nm and about 500 nm.

With reference to FIGS. 2 and 5, the word line capping layer 205-5 may be disposed on the word line electrode 205-3. The top surface of the word line capping layer 205-5 may be even with the top surface of the substrate 201. The word line capping layer 205-5 may be formed of, for example, silicon oxide, silicon nitride, silicon oxynitride, silicon nitride oxide, fluoride-doped silicate, or the like.

With reference to FIGS. 2 and 5, the impurity regions 207 may be disposed in the upper portion of the substrate 201. The impurity regions 207 may disposed between the two word line structures 205 and disposed between the two word line structures 205 and the isolation layer 203. The impurity regions 207 may be doped with a dopant such as phosphorus, arsenic, or antimony.

With reference to FIGS. 2 and 5, the insulating layers 217, 219, 221, 223 may be stacked on the substrate 201. The insulating layers 217, 219, 221, 223 may be formed of a same material as the insulating layer 131 but are not limited thereto.

With reference to FIGS. 2 and 5, the bit line contact 209 may be disposed in the insulating layer 217. The bit line contact 209 may be disposed on and electrically connected to the impurity region 207 disposed between the two word line structures 205. The bit line contact 209 may be formed of, for example, doped polysilicon, a metal, or a metal silicide.

With reference to FIGS. 2 and 5, the bit line 211 may be disposed in the insulating layer 219. The bit line 211 may be disposed on and electrically connected to the bit line contact 209. The bit line 211 may be formed of, for example, doped polysilicon, copper, nickel, cobalt, aluminum, tungsten, or a combination thereof.

With reference to FIGS. 2 and 5, the capacitor contacts 213 may be disposed penetrating the insulating layers 217, 219, 221. The capacitor contacts 213 may be respectively correspondingly disposed on and electrically connected to the impurity regions 207 disposed between the two word line structures 205 and the isolation layer 203. The capacitor contacts 213 may be formed of, for example, doped polysilicon, titanium, titanium nitride, tantalum, tantalum nitride, tungsten, copper, aluminum or aluminum alloy.

With reference to FIGS. 2 and 5, the capacitor structures 215 may be disposed in the insulating layer 223 and respectively correspondingly disposed on the capacitor contacts 213. The capacitor structures 215 may be electrically connected to the capacitor contacts 213. The capacitor structures 215 may include capacitor bottom electrodes 215-1, a capacitor dielectric layer 215-3, and a capacitor top electrode 215-5.

With reference to FIGS. 2 and 5, the capacitor bottom electrode 215-1 may be inwardly disposed in the insulating layer 223. The bottom surfaces of the capacitor bottom electrode 215-1 may respectively correspondingly contact to the top surfaces of the capacitor contact 213. The capacitor bottom electrode 215-1 may be formed of, for example, doped polysilicon, metal, or metal silicide. The capacitor dielectric layer 215-3 may be disposed on the capacitor bottom electrode 215-1 and cover the top surface of the insulating layer 223. The capacitor dielectric layer 215-3 may be formed of a single layer including an insulating material having a dielectric constant of about 4.0 or greater. The capacitor dielectric layer 215-3 may have a thickness between about 1 angstrom and about 100 angstroms. Alternatively, in another embodiment, the capacitor dielectric layer 215-3 may be formed of a stacked layer consisting of silicon oxide, silicon nitride, and silicon oxide. The capacitor top electrode 215-5 may be disposed on the capacitor dielectric layer 215-3. The capacitor top electrode 215-5 may be formed of, for example, doped polysilicon or metal.

Figure 6:
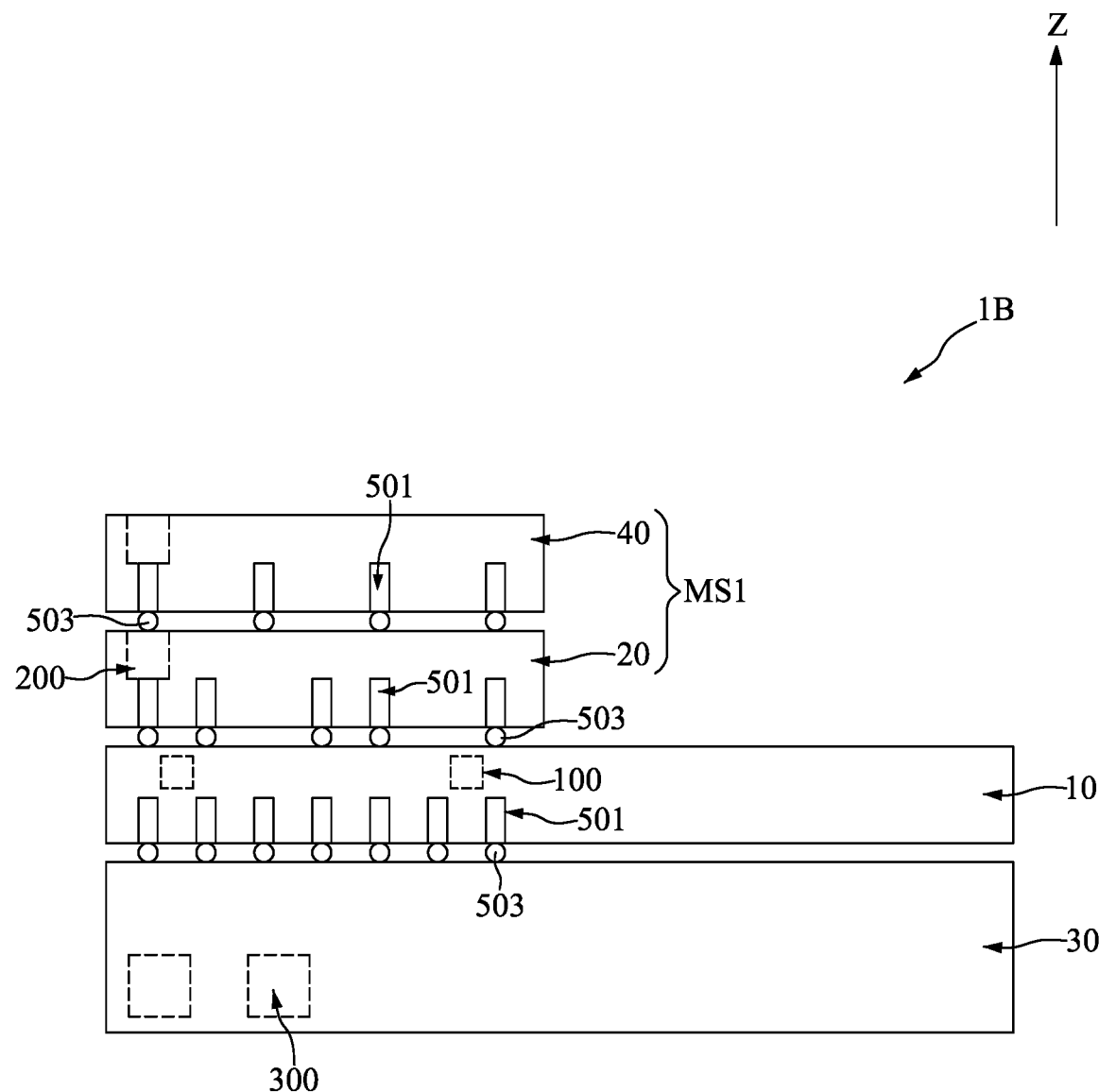
FIG. 6 illustrates, in a schematic cross-sectional view diagram, a semiconductor device in accordance with one embodiment of the present disclosure.
Figure 7:
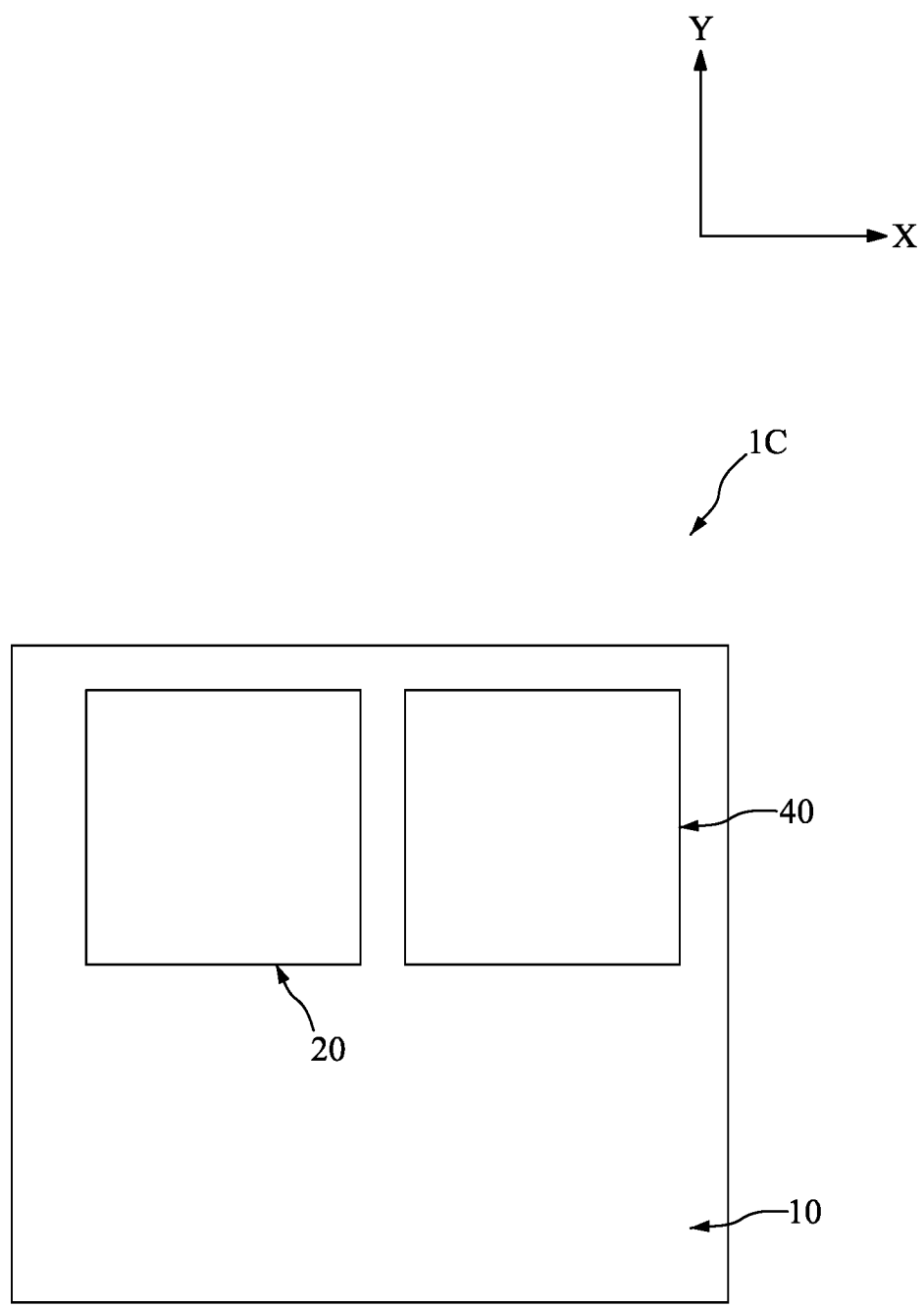
FIG. 7 illustrates, in a schematic top-view diagram, a semiconductor device in accordance with one embodiment of the present disclosure.
Figure 8:
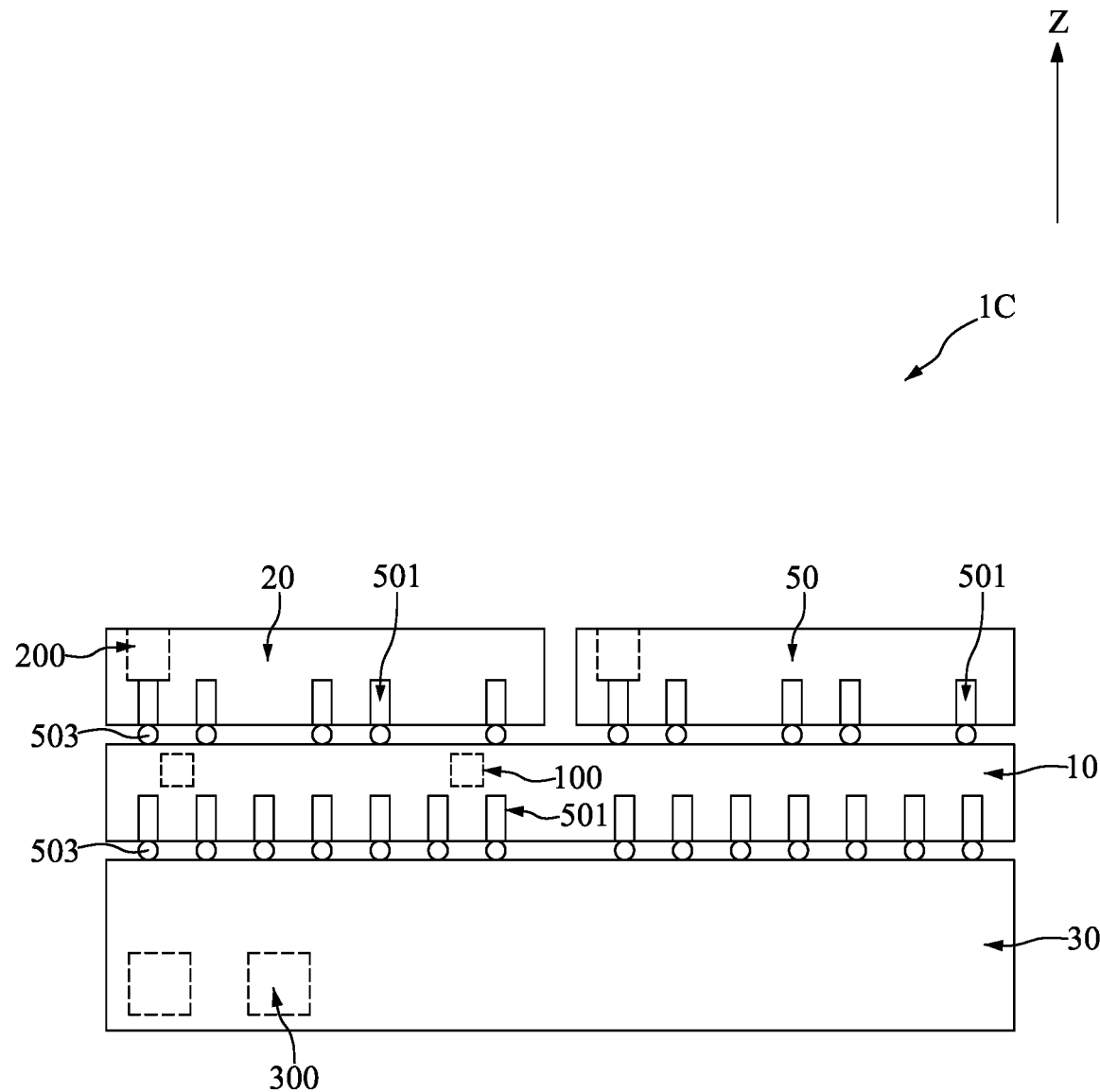
FIG. 8 illustrates, in a schematic cross-sectional view diagram, the semiconductor device in accordance with one embodiment of the present disclosure.
Figure 9:
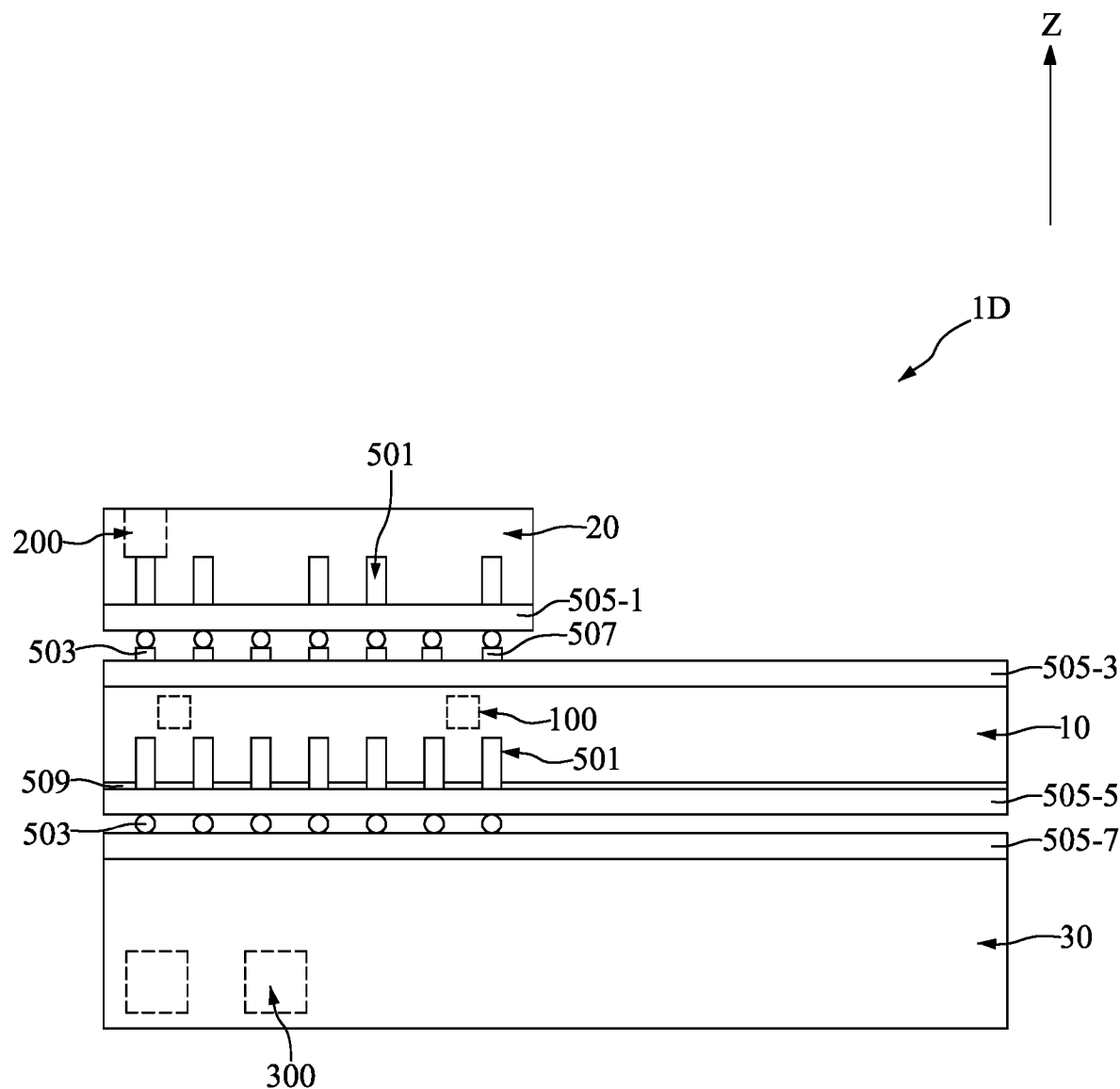
FIG. 9 illustrates, in a schematic cross-sectional view diagram, a semiconductor device in accordance with one embodiment of the present disclosure.

FIG. 6 illustrates, in a schematic cross-sectional view diagram, a semiconductor device 1B in accordance with one embodiment of the present disclosure. FIG. 7 illustrates, in a schematic top-view diagram, a semiconductor device 1C in accordance with one embodiment of the present disclosure. FIG. 8 illustrates, in a schematic cross-sectional view diagram, the semiconductor device 1C in accordance with one embodiment of the present disclosure. FIG. 9 illustrates, in a schematic cross-sectional view diagram, a semiconductor device 1D in accordance with one embodiment of the present disclosure.

With reference to FIG. 6, in the semiconductor device 1B, a second memory die 40 may be disposed on the first memory die 20. The second memory die 40 and the first memory die 20 may be electrically coupled through the through substrate vias 501 and the micro-bumps 503. The second memory die 40 may have a similar structure with the first memory die 20. The first memory die 20 and the second memory die 40 together form a memory stack MS1. The memory stack MS1 may increase the bandwidth of the semiconductor device 1B and may improve the power efficiency of the semiconductor device 1B. It should be noted that more memory die may be stacked to form a memory stack disposed on the active interposer 10.

With reference to FIGS. 7 and 8, in the semiconductor device 1C, a third memory die 50 may be disposed on the active interposer 10 and adjacent to the first memory die 20. The third memory die 50 may have a similar structure with the first memory die 20. The third memory die 50 and the active interposer 10 may be electrically coupled through the through substrate vias 501 and the micro-bumps 503. The third memory die 50 and the first memory die 20 may be electrically coupled through the active interposer 10.

With reference to FIG. 9, in the semiconductor device 1D, redistribution layers 505-1, 505-3, 505-5, 505-7 may be respectively correspondingly disposed between the active interposer 10 and the first memory die 20 and between the active interposer 10 and the first logic die 30.

Specifically, the redistribution layers 505-1, 505-3, 505-5, 505-7 may be disposed on the bottom surface of the first memory die 20, on the top surface of the active interposer 10, on the bottom surface of the active interposer 10, and on the top surface of the first logic die 30, respectively. The redistribution layer 505-1 may be disposed between the through substrate via 501 disposed in the first memory die 20 and the micro-bumps 503 disposed between the active interposer 10 and the first memory die 20. The redistribution layer 505-3 may be disposed between the active interposer 10 and the micro-bumps 503 disposed between the active interposer 10 and the first memory die 20. The redistribution layer 505-5 may be disposed between the active interposer 10 and the micro-bumps 503 disposed between the active interposer 10 and the first logic die 30. The redistribution layer 505-7 may be disposed between the first logic die 30 and the micro-bumps 503 disposed between the active interposer 10 and the first logic die 30. The redistribution layers 505-1, 505-3, 505-5, 505-7 may be electrically coupled to the active interposer 10, the first memory die 20, the first logic die 30, the through substrate vias 501, and the micro-bumps 503.

With reference to FIG. 9, micro-pillars 507 may be disposed between the redistribution layer 505-3 and the micro-bumps 503 disposed between the active interposer 10 and the first memory die 20. The micro-pillars 507 may electrically be coupled to the micro-bumps 503 and the redistribution layer 505-3. Each of the micro-pillars 507 may be stacked layer including, form bottom to top, a first layer, a second layer, and a third layer. The first layer may be formed of copper and may have a thickness between about 1 μm and about 5 μm. The second layer may be formed of nickel and may have a thickness between about 1 μm and about 3 μm. The third layer may be formed of gold and may have a thickness between about 0.05 μm and about 0.2 μm.

With reference to FIG. 9, a passivation layer 509 may be disposed between the active interposer 10 and the redistribution layer 505-5. The through substrate vias 501 disposed in the active interposer 10 may penetrate the passivation layer 509 and connect the redistribution layer 505-5. The passivation layer 509 may be formed of, for example, silicon nitride.

The redistribution layers 505-1, 505-3, 505-5, 505-7 may re-route the electrical connections from the through substrate vias 501 to larger bond-pads to minimize challenges associated with perfect alignment between the through substrate vias 501 and the micro-bumps 503 or the micro-pillars 507, and to fan out and/or enlarge the inter-die joints. In addition to relaxing constraints associated with joint spacing and size, the redistribution layers 505-1, 505-3, 505-5, 505-7 may also reduce the insertion losses of the through substrate vias 501, while also improving signal transmission and reliability.

It should be noted that the terms "forming," "formed" and "form" may mean and include any method of creating, building, patterning, implanting, or depositing an element, a dopant or a material. Examples of forming methods may include, but are not limited to, atomic layer deposition, chemical vapor deposition, physical vapor deposition, sputtering, co-sputtering, spin coating, diffusing, depositing, growing, implantation, photolithography, dry etching, and wet etching.

Figure 10:
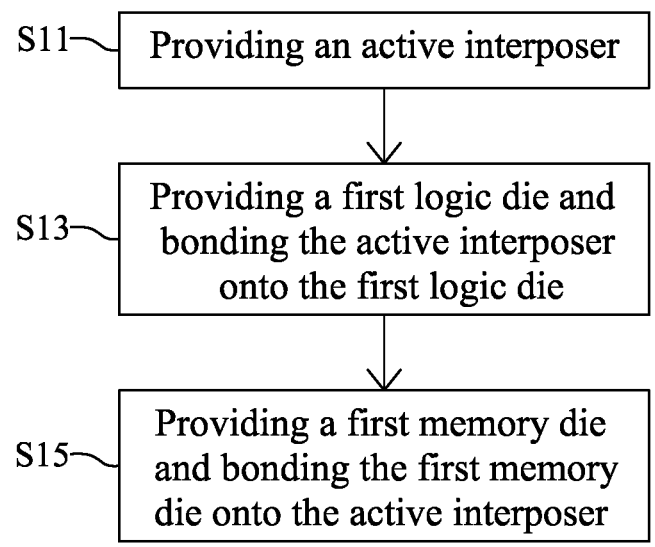
FIG. 10 illustrates, in a flowchart diagram form, a method for fabricating a semiconductor device in accordance with one embodiment of the present disclosure.

FIG. 10 illustrates, in a flowchart diagram form, a method 60 for fabricating a semiconductor device 1D in accordance with one embodiment of the present disclosure. FIGS. 11 to 26 illustrate, in schematic cross-sectional view diagrams, a flow for fabricating the semiconductor device 1D in accordance with one embodiment of the present disclosure.

Figure 11:
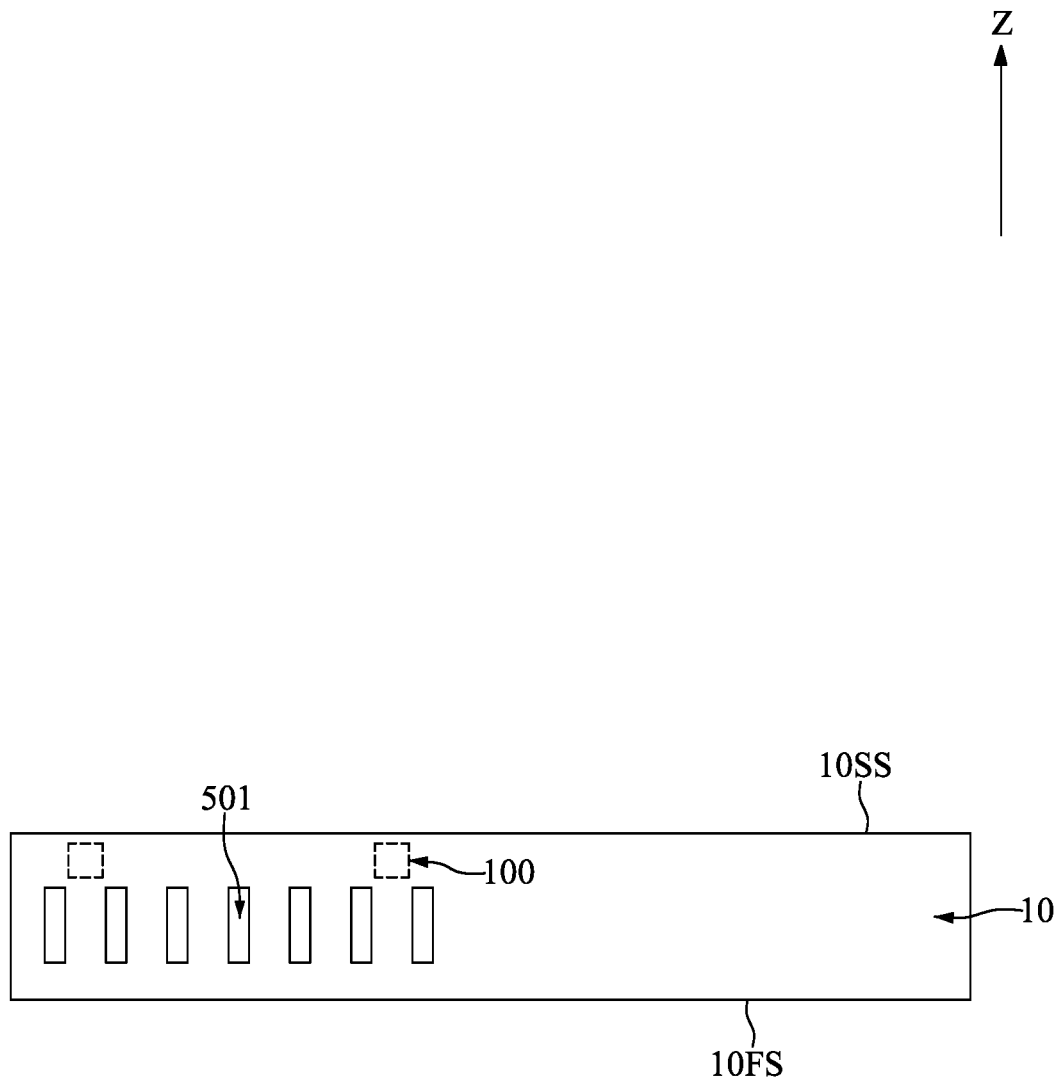
FIGS. 11 to 26 illustrate, in schematic cross-sectional view diagrams, a flow for fabricating the semiconductor device in accordance with one embodiment of the present disclosure.

With reference to FIGS. 10 and 11, at step S11, an active interposer 10 may be provided.

With reference to FIG. 11, the active interposer 10 may include a plurality of programmable units 100, a first side 10FS, and a second side 10SS. The first side 10FS and the second side 10SS may be parallel to each other. The plurality of the programmable units 100 may be formed adjacent to the second side 10ss. Through substrate vias 501 may be formed in the active interposer 10 and formed adjacent to the first side 10FS. In some embodiments, the through substrate vias 501 may be formed before the formation of the plurality of programmable units 100. In some embodiments, the through substrate vias 501 may be formed during the formation of the plurality of programmable units 100. In some embodiments, the through substrate vias 501 may be formed after the formation of the plurality of programmable units 100.

With reference to FIG. 10 and FIGS. 12 to 19, at step S13, a first logic die 30 may be provided and the active interposer 10 may be bonded onto the first logic die 30.

Figure 12:
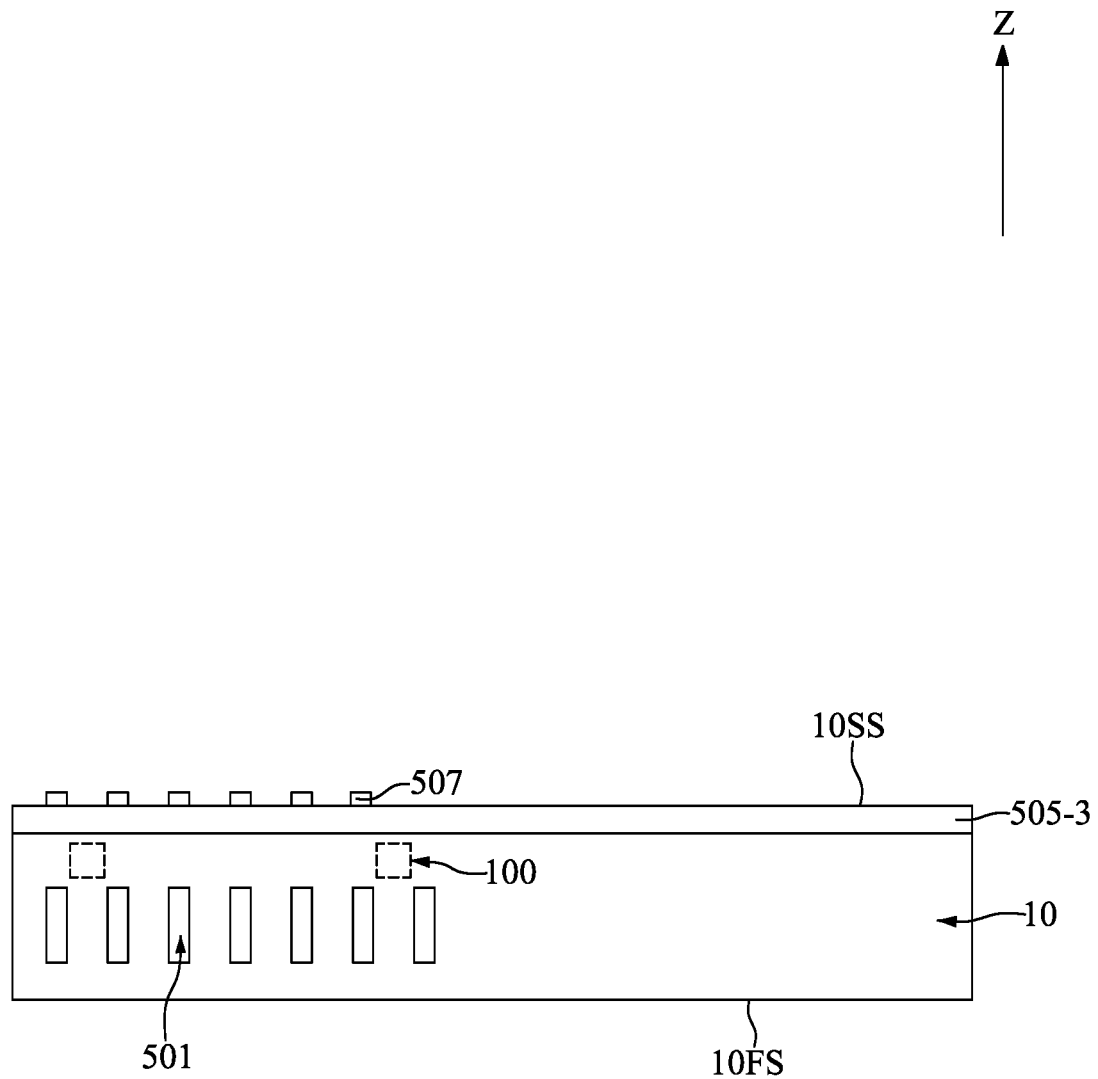

With reference to FIG. 12, a redistribution layer 505-3 may be formed on the second side 10SS of the active interposer 10. The redistribution layer 505-3 may be electrically coupled to the active interposer 10. A plurality of micro-pillars 507 may be formed on the redistribution layer 505-3. In other words, the plurality of micro-pillars 507 may be opposite to the active interposer 10 with the redistribution layer 505-3 interposed therebetween.

Figure 13:
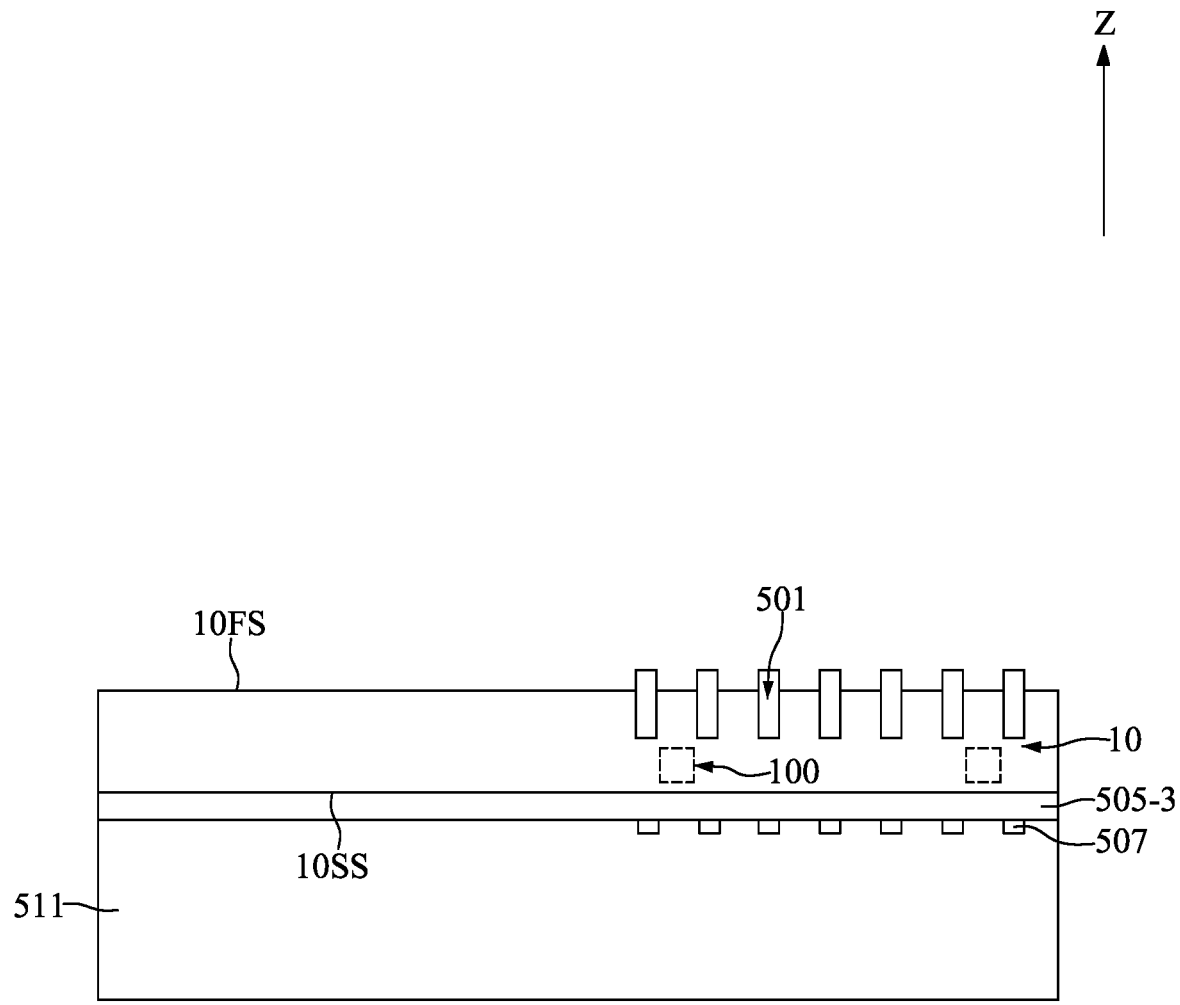

With reference to FIG. 13, a first carrier layer 511 may be bonded onto the redistribution layer 505-3 and cover the micro-pillars 507. Subsequently, the intermediate semiconductor device may be flipped up-side down to make the first side 10FS of the active interposer 10 faced upward. A removal process may be performed to the intermediate semiconductor device from top to reduce the thickness of the active interposer 10 and expose ends of the through substrate vias 501. The ends of the through substrate vias 501 may protrude from the first side 10FS of the active interposer 10. The removal process may include a planarization process, such as chemical mechanical polishing, and an etch process such as wet etching.

Figure 14:
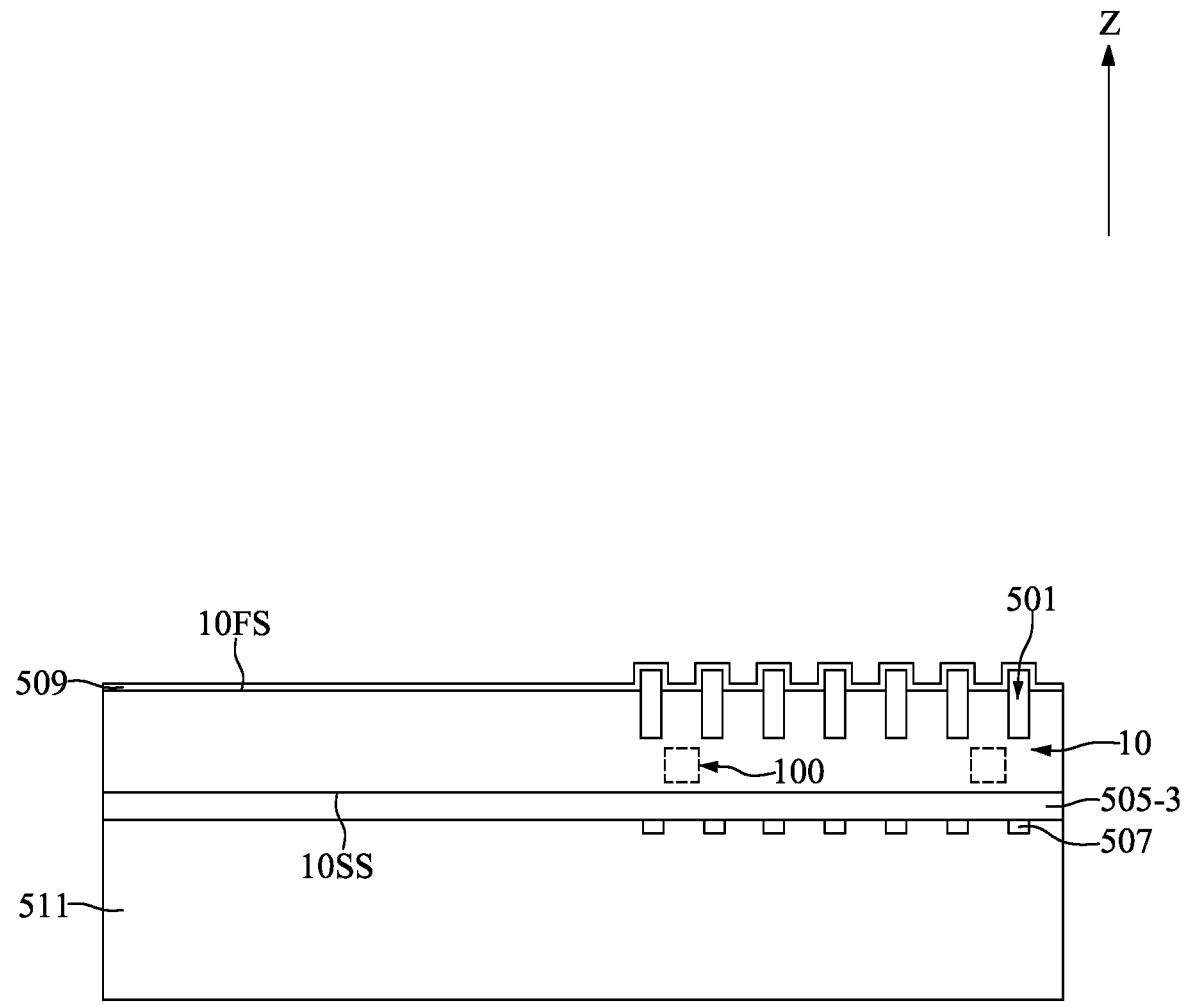

With reference to FIG. 14, a passivation layer 509 may be formed to cover the first side 10FS of the active interposer 10 and the ends of the through substrate vias 501. The passivation layer 509 may prevent the ends of the through substrate vias 501 from oxidation.

Figure 15:
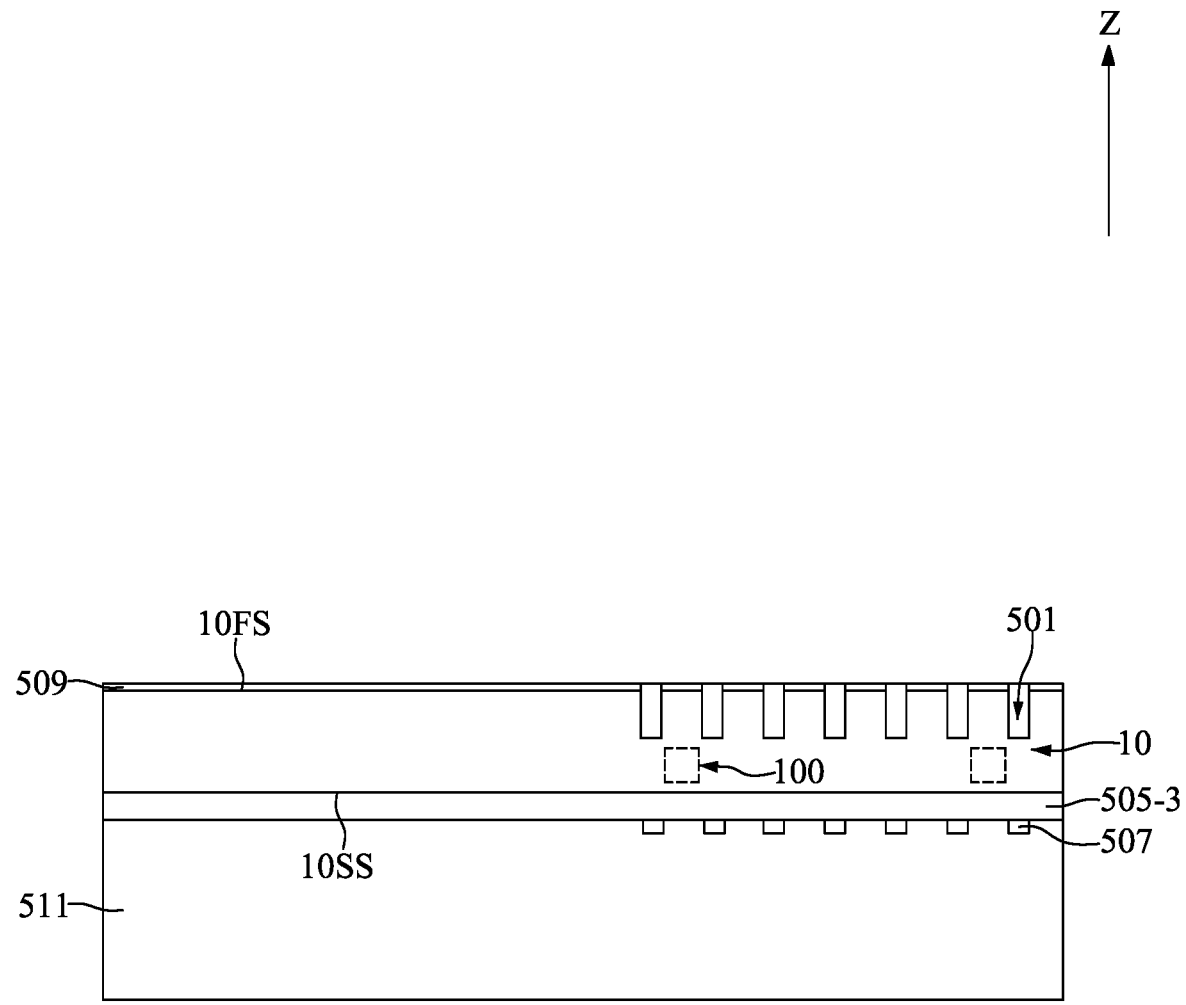

With reference to FIG. 15, a planarization process, such as chemical mechanical polishing, may be performed to provide a substantially flat surface for subsequent processing steps. The through substrate vias 501 and the passivation layer 509 may be substantially coplanar after the planarization process. Portions of the through substrate vias 501 may be exposed after the planarization process.

Figure 16:
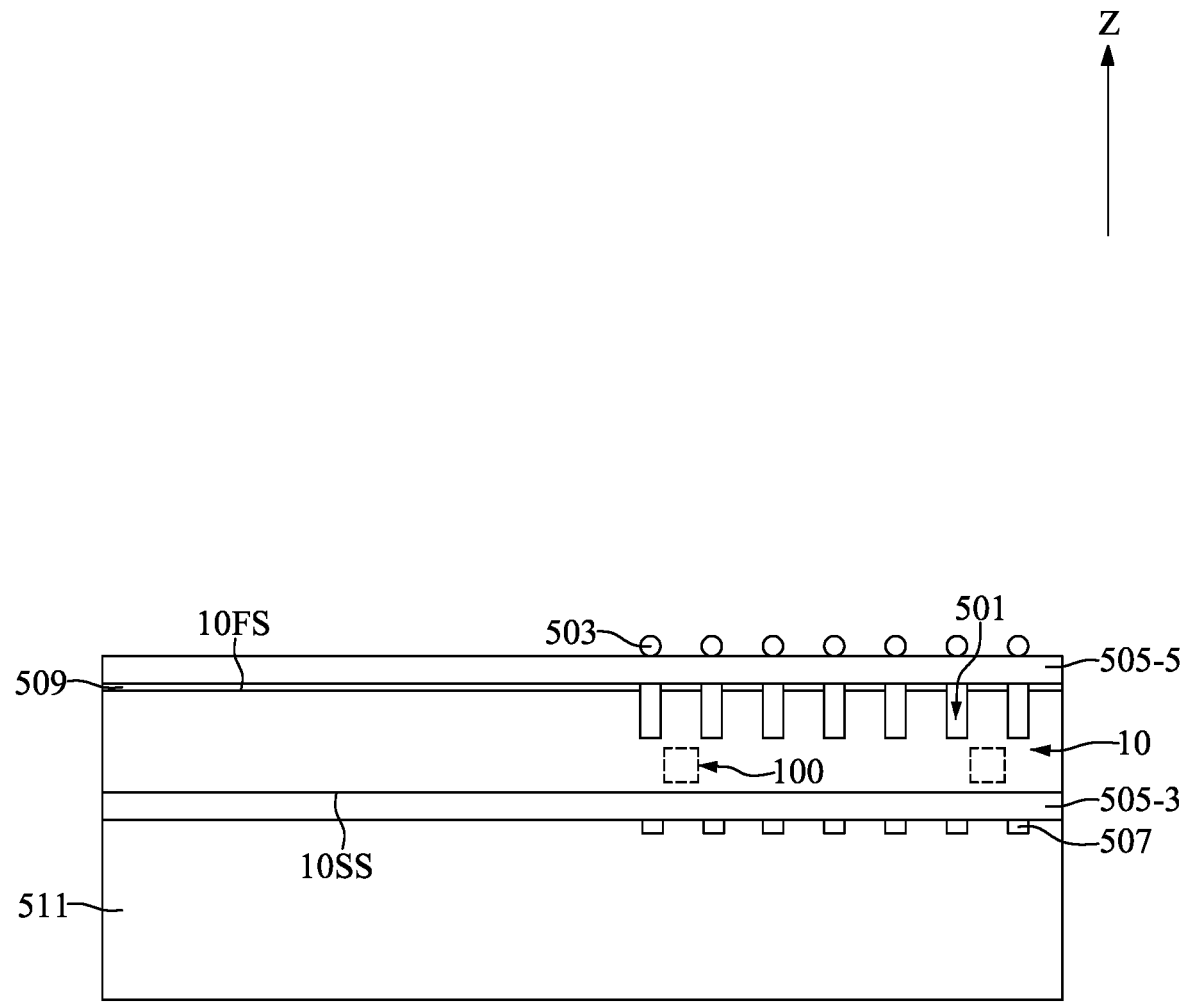

With reference to FIG. 16, a redistribution layer 505-5 may be formed on the passivation layer 509 and the through substrate vias 501. The redistribution layer 505-5 may be electrically coupled to the through substrate vias 501. Subsequently, micro-bumps 503 may be formed on the redistribution layer 505-5. The micro-bumps 503 may be electrically coupled to the redistribution layer 505-5.

Figure 17:
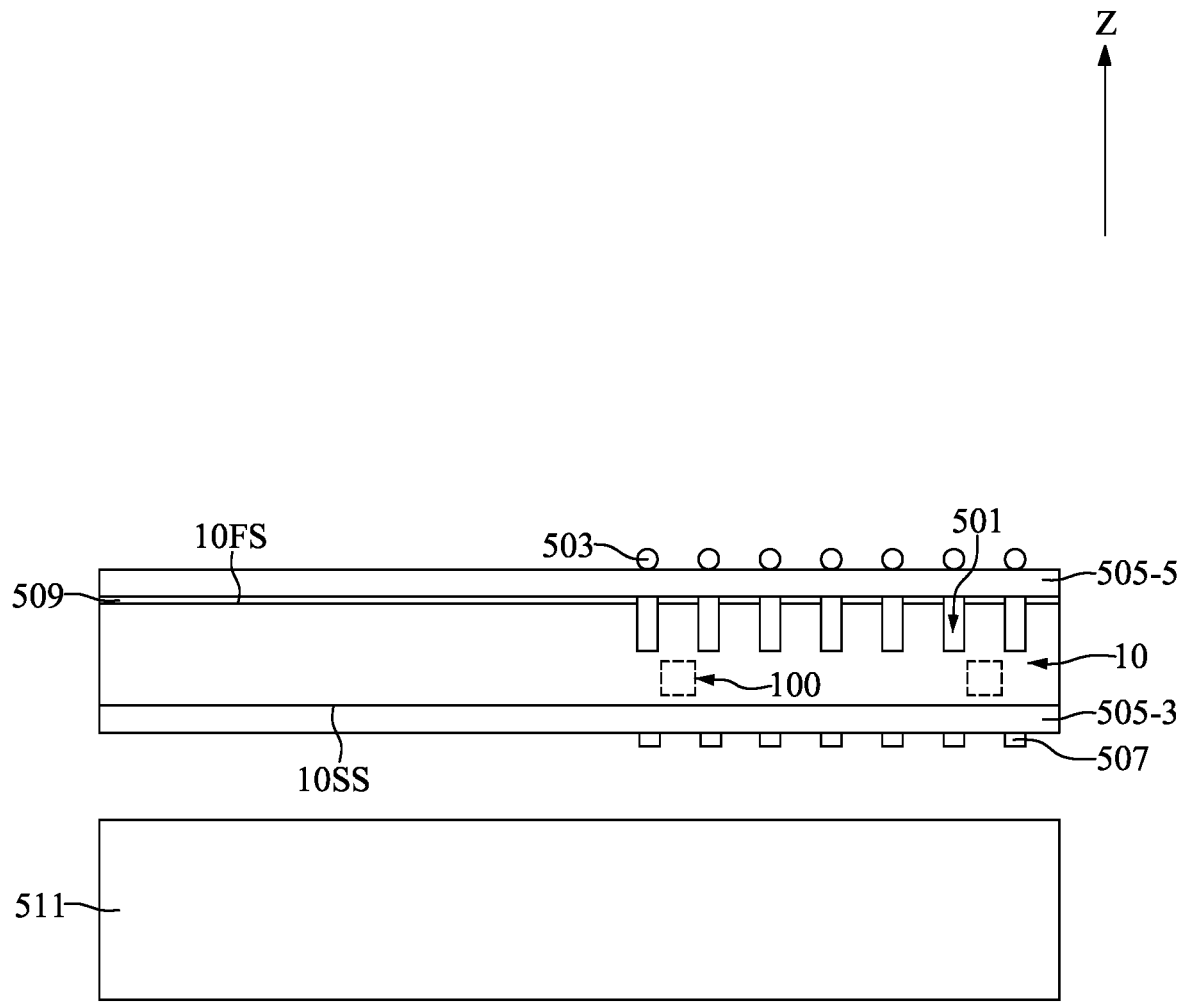

With reference to FIG. 17, a separation process may be performed to separate the first carrier layer 511 and the active interposer 10. The separation process may be performed by applying an ultra-violet light or a thermal source to the intermediate semiconductor device. The micro-pillars 507 may be exposed after the separation process.

Figure 18:
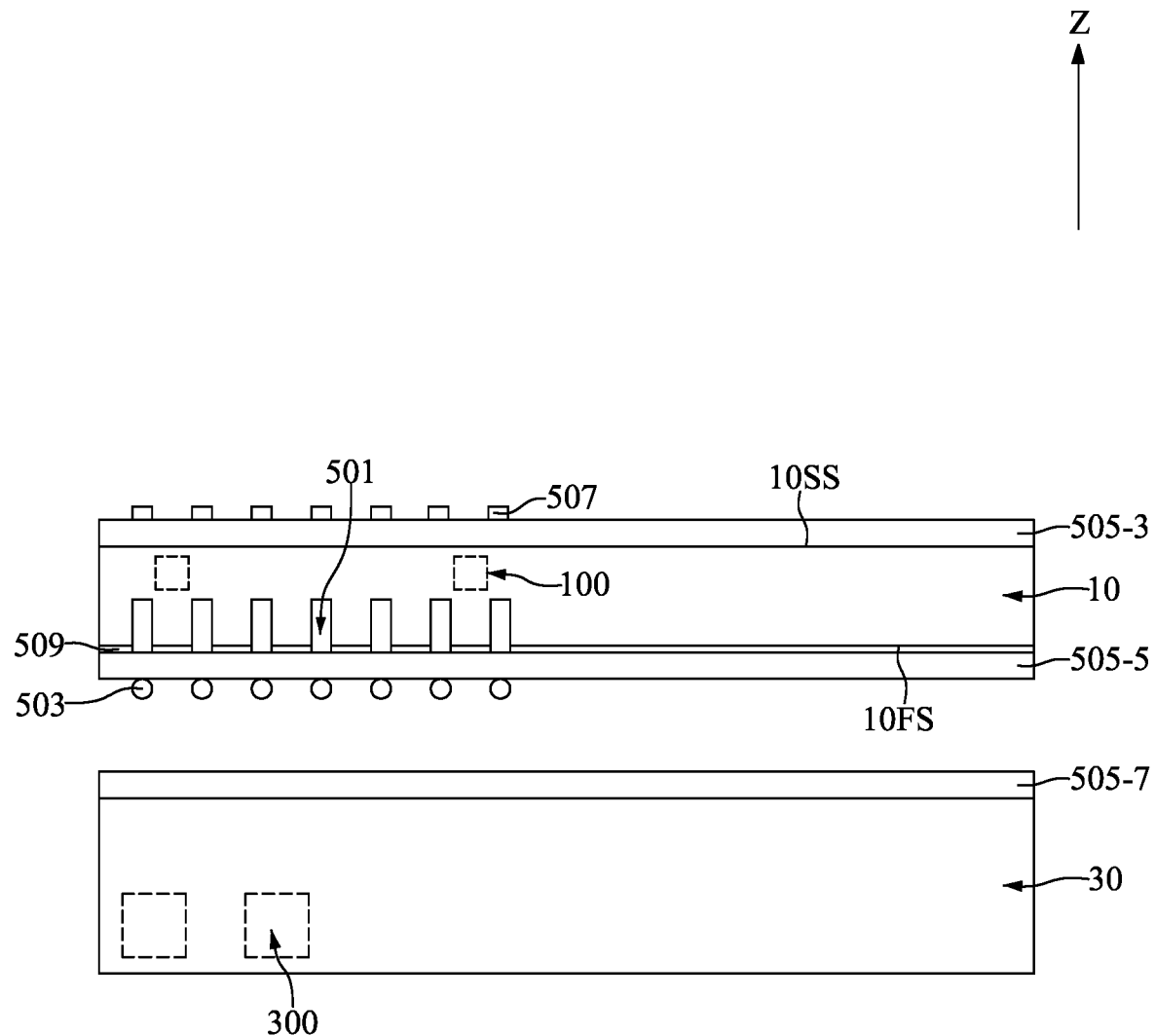

With reference to FIG. 18, a first logic die 30 may be provided. A redistribution layer 505-7 may be formed on the first logic die 30. The redistribution layer 505-7 may be electrically coupled to the first logic die 30. The active interposer 10 illustrated in FIG. 17 may be flipped back to make the first side 10FS of the active interposer 10 faced downward. Due to the active interposer 10 and the first logic die 30 are separately fabricated, the first logic die 30 may be fabricated before/during/after the fabrication of the active interposer 10 illustrated in FIG. 17.

Figure 19:
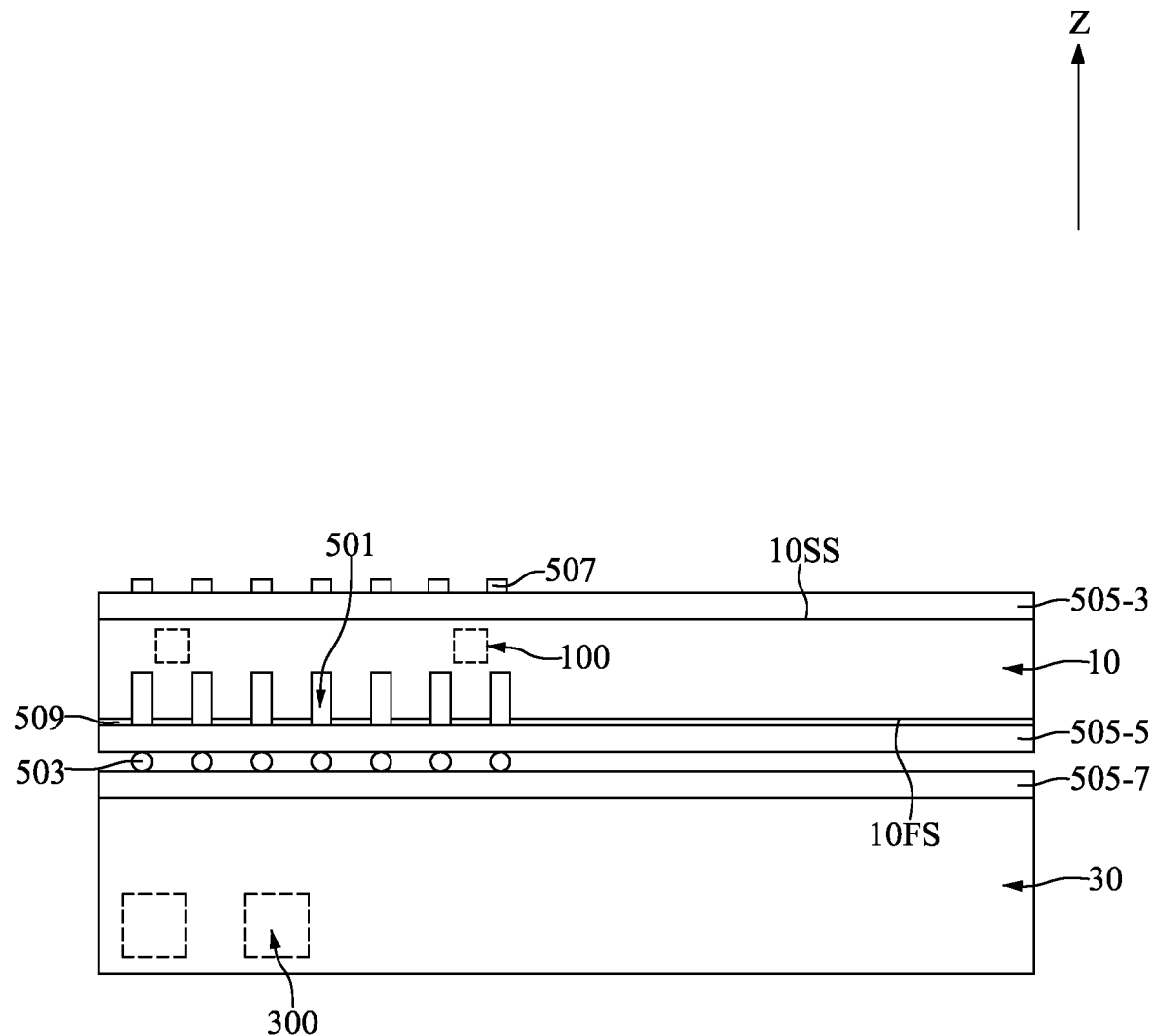

With reference to FIG. 19, a bonding process may be performed to bond the micro-bumps 503 onto the redistribution layer 505-7. The active interposer 10 and the first logic die 30 may be electrically coupled through the through substrate vias 501, the micro-bumps 503, and the redistribution layers 505-5, 505-7. The bonding process may be performed by applying a thermal source to the intermediate semiconductor device.

With reference to FIG. 10 and FIGS. 20 to 26, at step S15, a first memory die 20 may be provided and the first memory die 20 may be bonded onto the active interposer 10.

Figure 20:
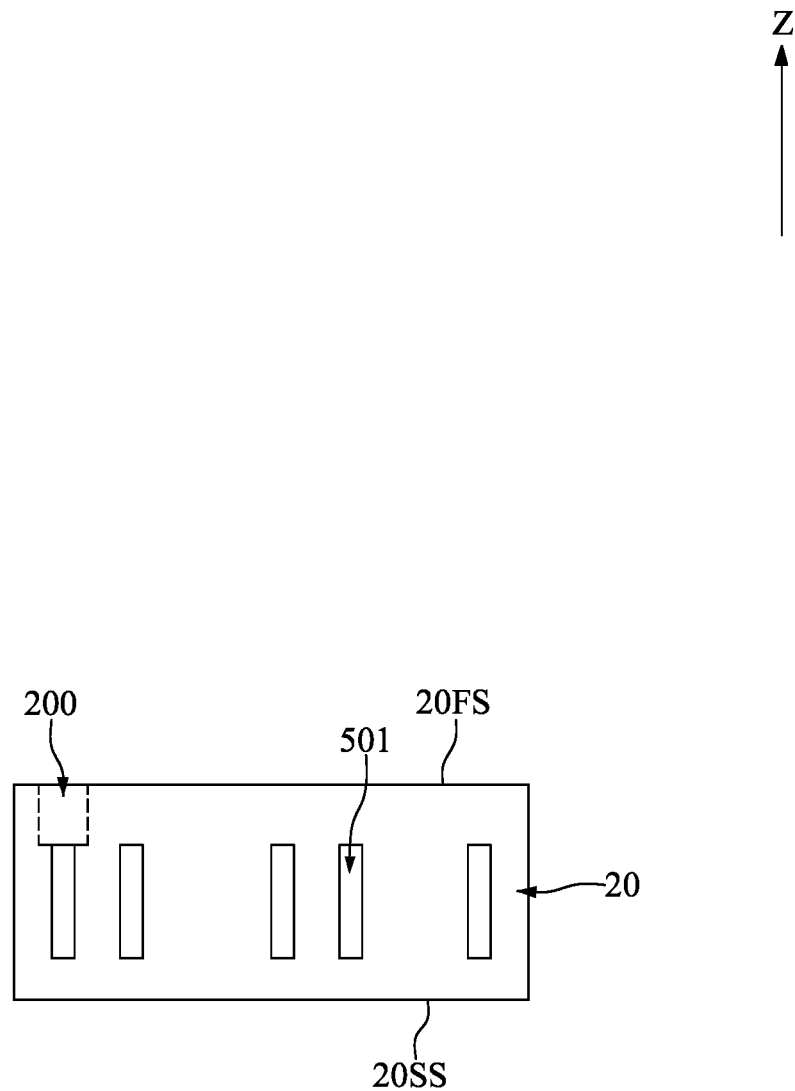

With reference to FIG. 20, the first memory die 20 may be provided. The first memory die 20 may include a plurality of storage units 200, a first side 20FS, and a second side 20SS. The first side 20FS and the second side 20SS may be parallel to each other. The plurality of storage units 200 may be formed adjacent to the first side 20FS of the first memory die 20. Through substrate vias 501 may be formed in the first memory die 20 and adjacent to the second side 20SS of the first memory die 20. In some embodiments, the through substrate vias 501 may be formed before the formation of the storage units 200. In some embodiments, the through substrate vias 501 may be formed during the formation of the plurality of storage units 200. In some embodiments, the through substrate vias 501 may be formed after the formation of the plurality of storage units 200.

Figure 21:
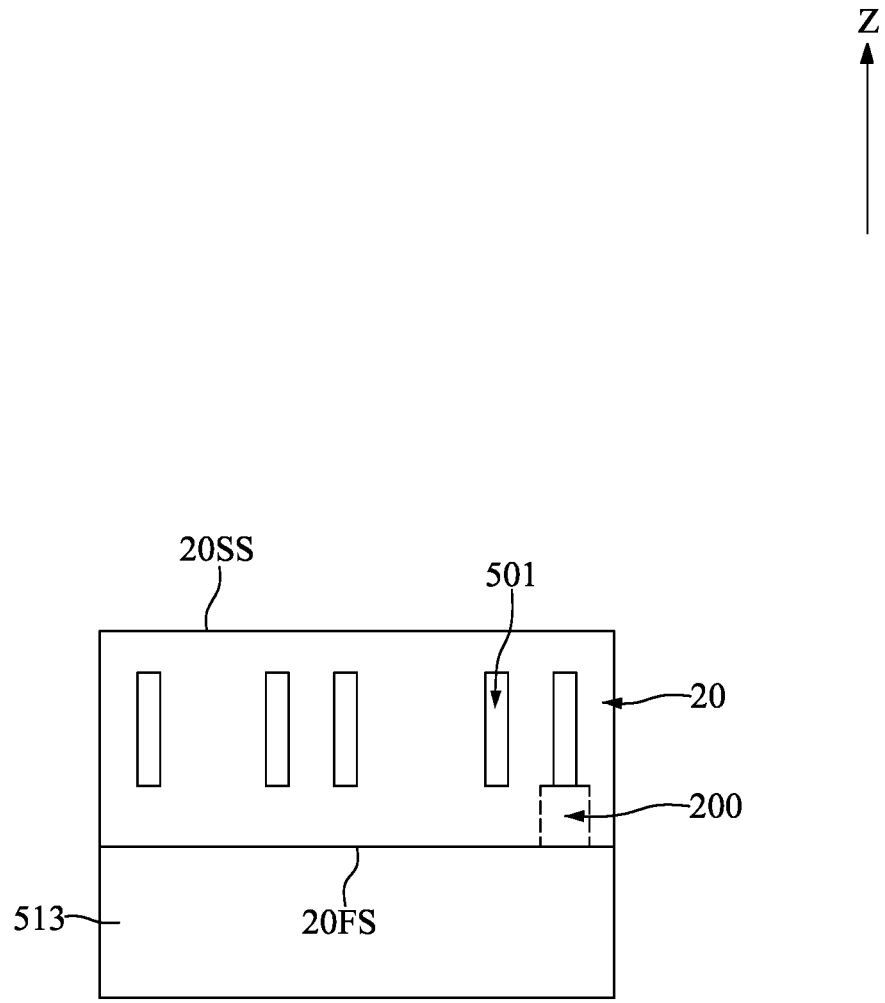

With reference to FIG. 21, a second carrier layer 513 may be bonded onto the first side 20FS of the first memory die 20. Subsequently, the intermediate semiconductor device may be flipped up-side down to make the second side 20SS of the first memory die 20 faced upward.

Figure 22:
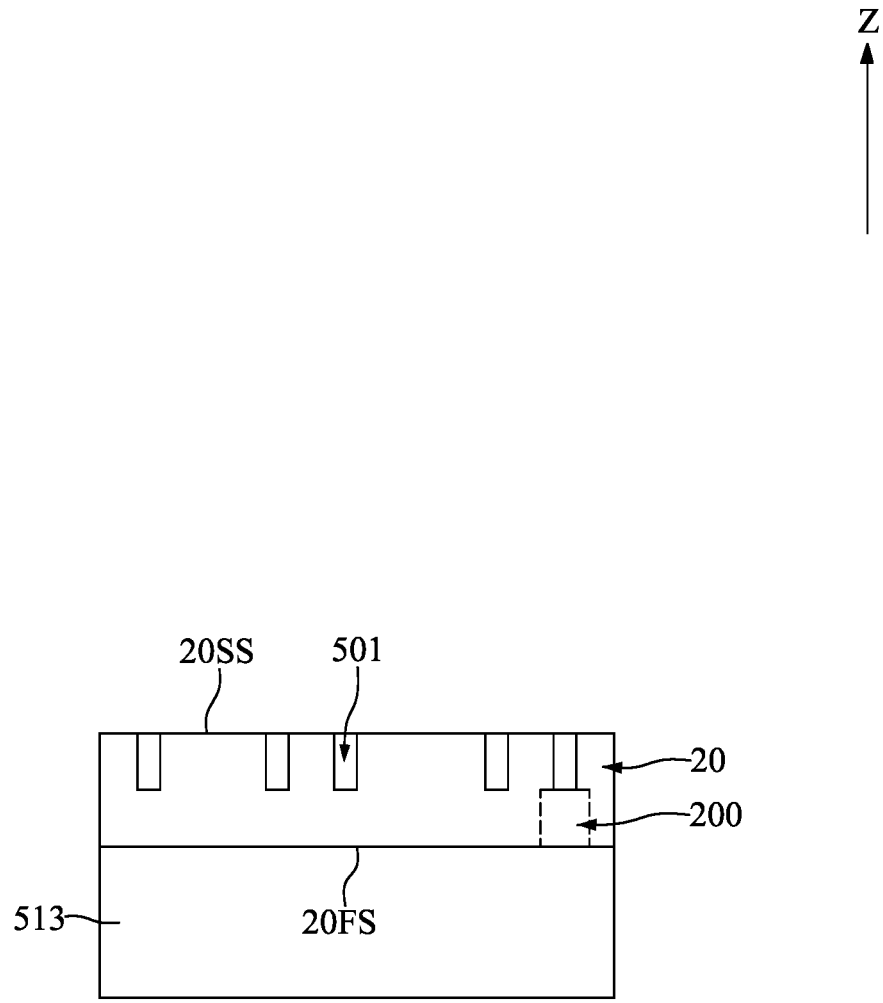

With reference to FIG. 22, a planarization process, such as chemical mechanical polishing, may be performed to provide a substantially flat surface for subsequent processing steps. Portions of the through substrate vias 501 may be exposed after the planarization process. In some embodiments, a procedure similar to that illustrated in FIGS. 13 to 15 may be performed on the second side 20SS of the first memory die 20 and a passivation layer (not shown) may be formed on the second side 20SS of the first memory die 20.

Figure 23:
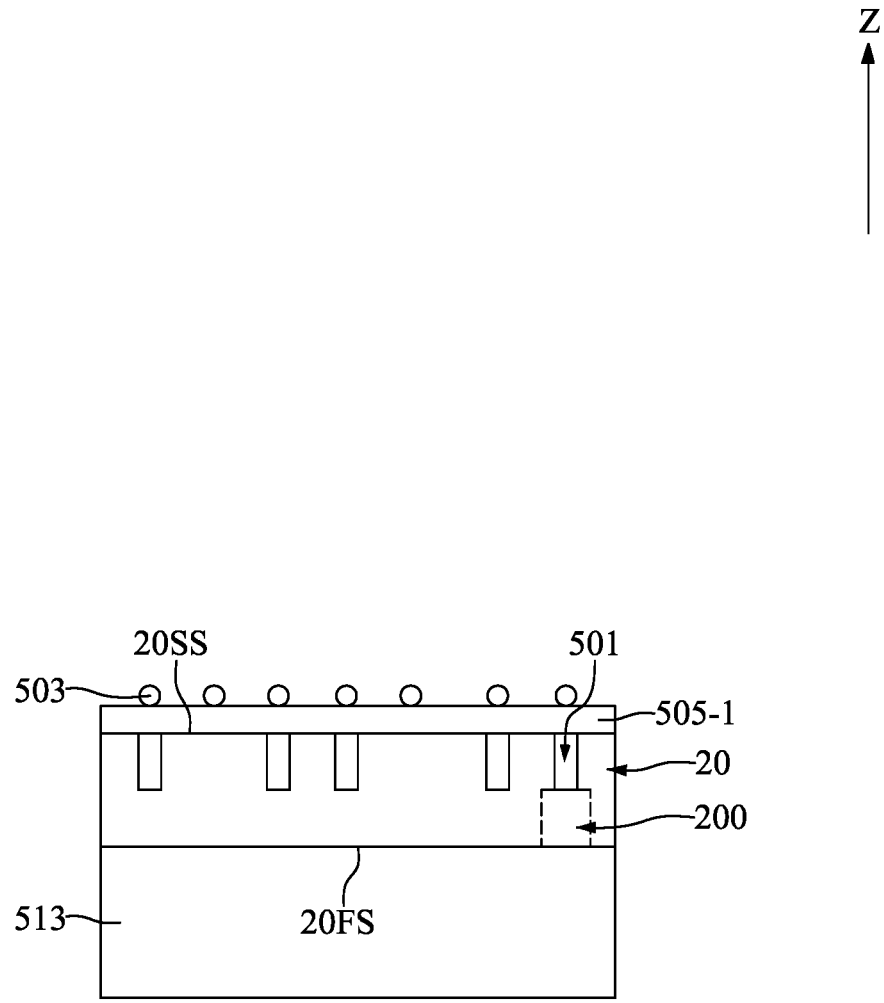

With reference to FIG. 23, a redistribution layer 505-1 may be formed on the second side 20SS of the first memory die 20 and the through substrate vias 501. The redistribution layer 505-1 may be electrically coupled to the through substrate vias 501. Subsequently, micro-bumps 503 may be formed on the redistribution layer 505-1. The micro-bumps 503 may be electrically coupled to the redistribution layer 505-1.

Figure 24:
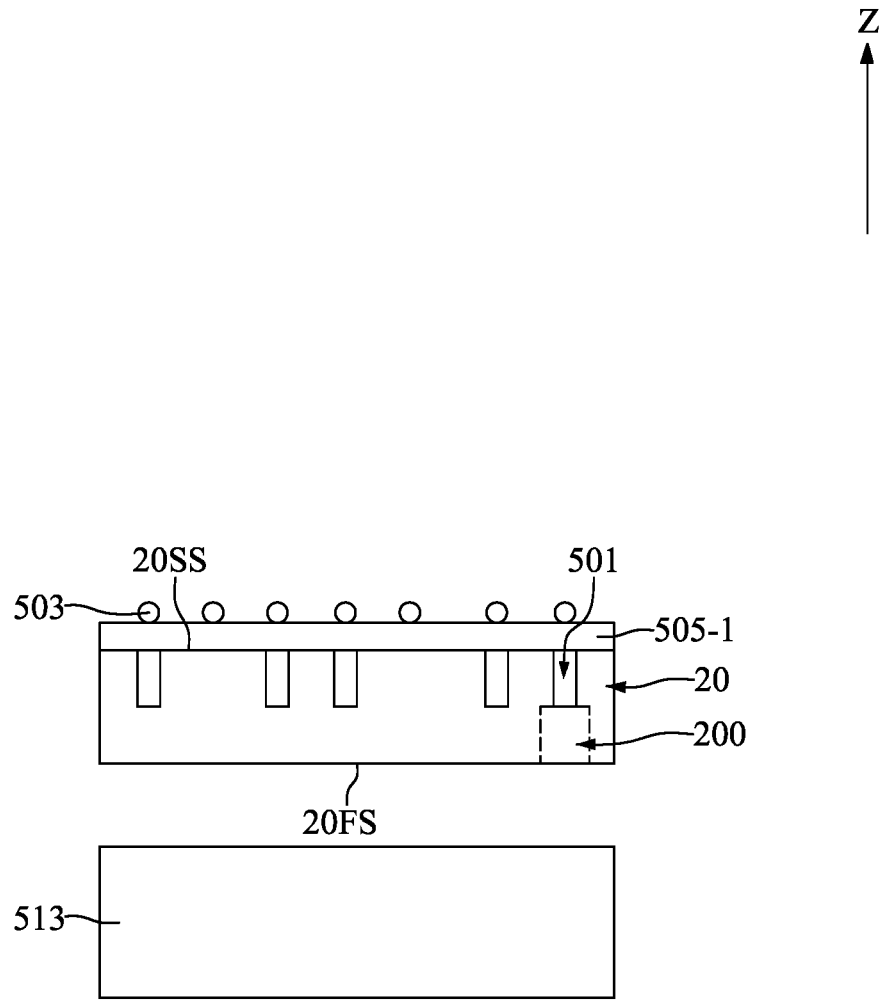

With reference to FIG. 24, a separation process may be performed to separate the second carrier layer 513 and the first memory die 20. The separation process may be performed with a procedure similar to that illustrated in FIG. 17.

Figure 25:
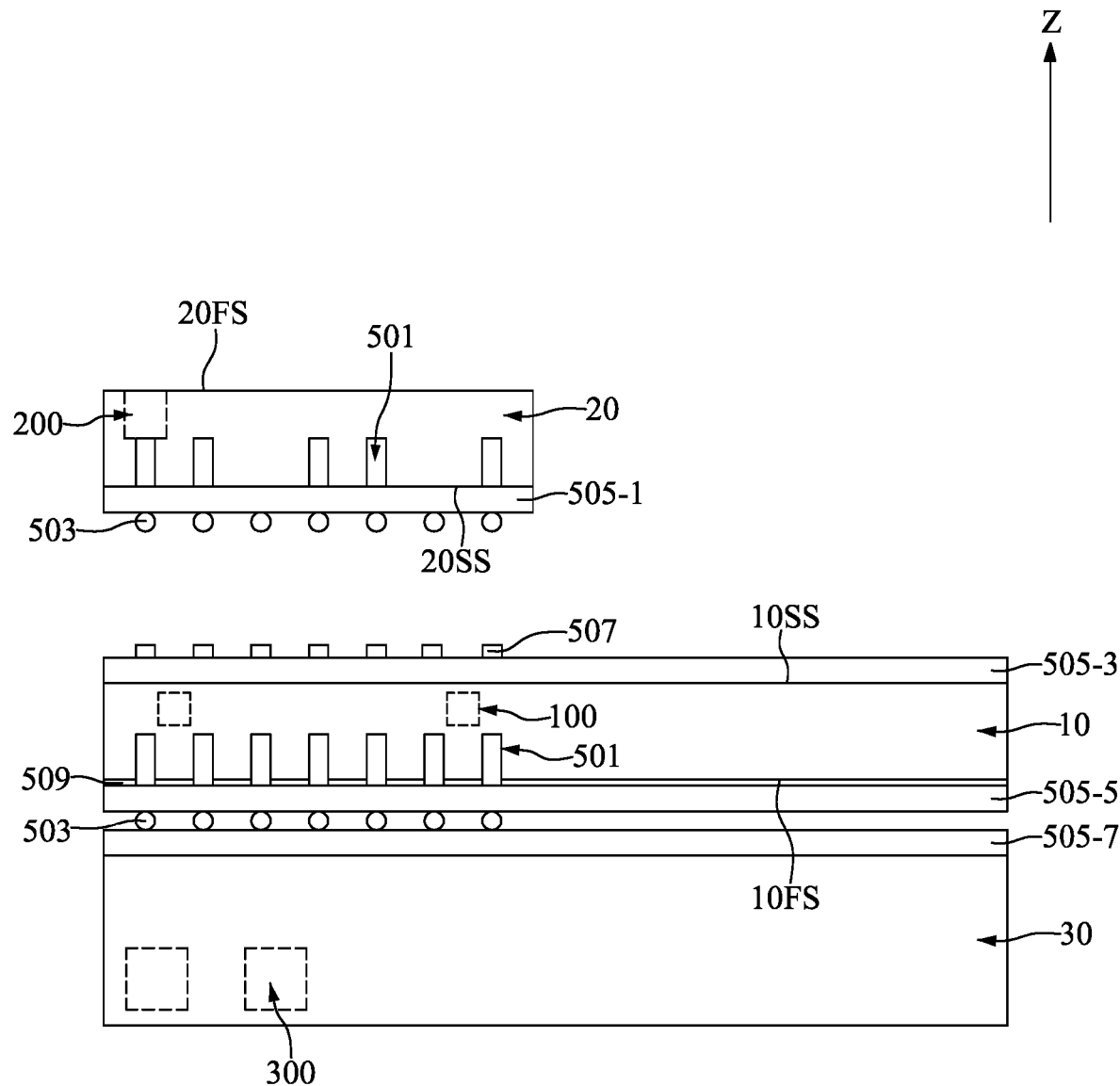
Figure 26:
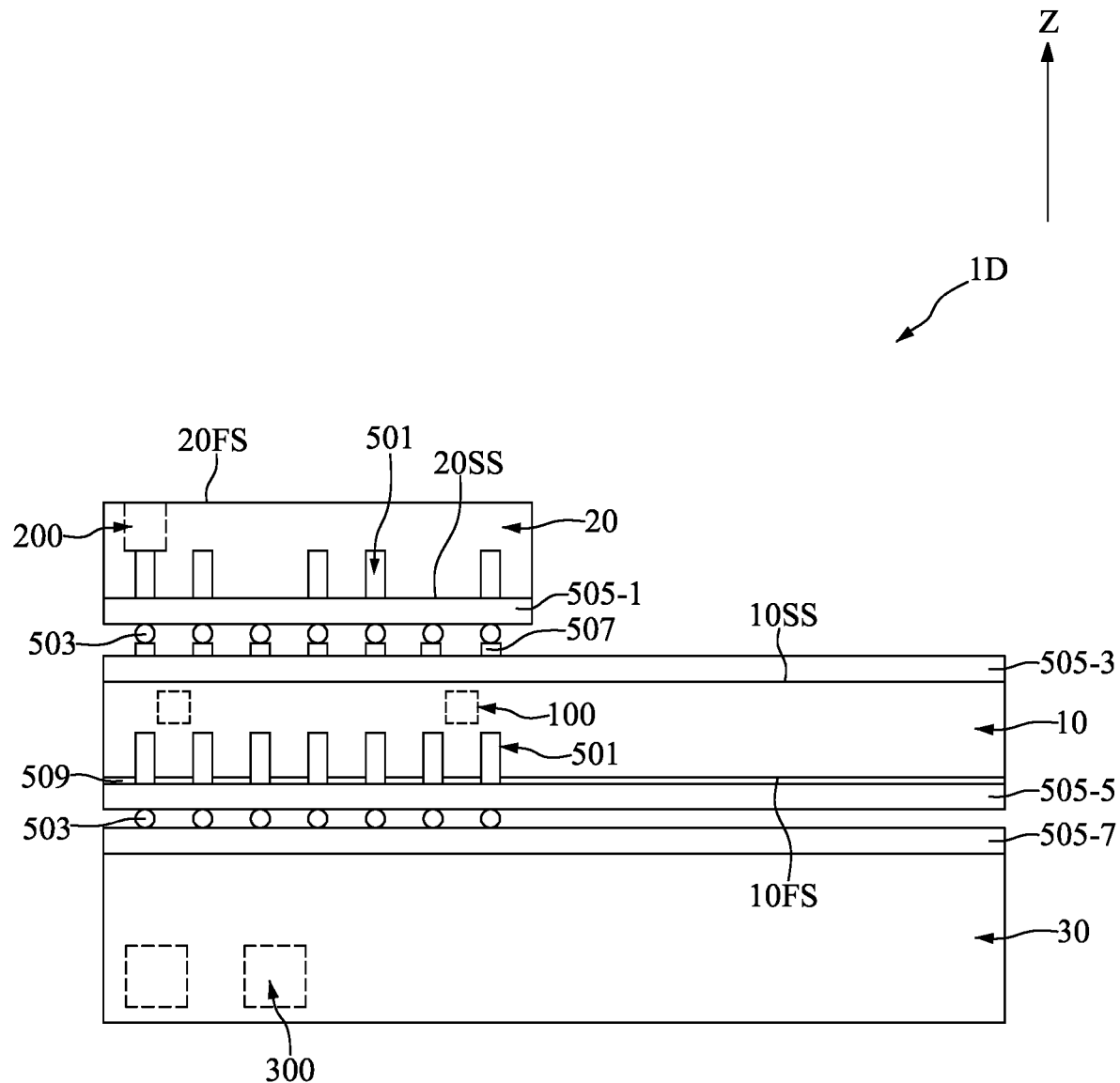

With reference to FIGS. 25 and 26, the first memory die 20 illustrated in FIG. 24 may be flipped back to make the second side 20SS of the first memory die 20 faced downward. Subsequently, a bonding process may be performed to bond the micro-bumps 503 formed on the redistribution layer 505-1 onto the micro-pillars 507. The active interposer 10 and the first memory die 20 may be electrically coupled through the through substrate vias 501, the micro-bumps 503, the micro-pillars 507, and the redistribution layers 505-1, 505-3. The bonding process may be performed by a procedure similar to that illustrated in FIG. 19.

One aspect of the present disclosure provides a semiconductor device including an active interposer including a programmable unit, a first memory die positioned above the active interposer and including a storage unit, and a first logic die positioned below the active interposer. The active interposer, the first memory die, and the first logic die are electrically coupled.

Another aspect of the present disclosure provides a method for fabricating a semiconductor device including providing an active interposer including a programmable unit, providing a first logic die and bonding a first side of the active interposer onto the first logic die, providing a first memory die including a storage unit, and, bonding the first memory die onto a second side of the active interposer. The second side of the active interposer is parallel to the first side of the active interposer.

Due to the design of the semiconductor device of the present disclosure, the first memory die 20 may only include the plurality of storage units 200. Therefore, the fabrication of the first memory die 20 may be simplified. As a result, the cost of fabrication of the semiconductor device 1A may be reduced. In addition, through substrate vias 501 may decrease interconnection length between the active interposer 10, the first memory die 20, and the first logic die 30 to improve the performance of the semiconductor device 1A.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A method for fabricating a semiconductor device, comprising:
providing an active interposer comprising a programmable unit;
providing a first logic die and bonding a first side of the active interposer onto the first logic die;

providing a first memory die comprising a storage unit;

bonding the first memory die onto a second side of the active interposer, wherein the second side of the active interposer is parallel to the first side of the active interposer; and positioning at least one of through substrate vias in the first memory die by the steps of:

facing a top surface of the through substrate via away from the active interposer;

encapsulating the top surface of the through substrate via in the first memory die; and facing a bottom surface of the through substrate via toward the active interposer, wherein a width of the top surface is larger than a width of the bottom surface.

2. The method for fabricating the semiconductor device of claim 1, further comprising a step of forming micro-pillars on the second side of the active interposer, wherein the first memory die and the active interposer are bonded through the micro-pillars.

3. The method for fabricating the semiconductor device of claim 2, further comprising a step of forming micro-bumps on the first side of the active interposer, wherein the active interposer and the first logic die are bonded through the micro-bumps.

4. The method for fabricating the semiconductor device of claim 1, positioning at least one of the through substrate vias in the active interposer, wherein the active interposer and the first logic die are electrically coupled through the through substrate vias.

5. The method for fabricating the semiconductor device of claim 1, wherein the active interposer and the first memory die are electrically coupled through the through substrate vias.

6. The method for fabricating the semiconductor device of claim 5, wherein the width of the top surface of each of the through substrate vias is between about 1 μm and about 22 μm.

7. The method for fabricating the semiconductor device of claim 5, wherein a depth of each of the through substrate vias is between about 20 μm and about 160 μm.

8. The method for fabricating the semiconductor device of claim 5, wherein an aspect ratio of each of the through substrate vias is between about 1:2 and about 1:35.

9. The method for fabricating the semiconductor device of claim 5, wherein each of the through substrate vias comprises a filler layer positioned in the first memory die and an insulating layer surrounding the filler layer, the filler layer is formed of polysilicon, tungsten, copper, carbon nanotube, or solder alloy, and the insulating layer is formed of silicon oxide, silicon nitride, silicon oxynitride, tetra-ethyl orthosilicate, parylene, epoxy, or poly(p-xylene).

10. The method for fabricating the semiconductor device of claim 9, further comprising: forming a barrier layer positioned between the insulating layer and the filler layer, wherein the barrier layer is formed of tantalum, tantalum nitride, titanium, titanium nitride, rhenium, nickel boride, or tantalum nitride/tantalum bilayer.

11. The method for fabricating the semiconductor device of claim 9, further comprising an adhesion layer positioned between the insulating layer and the filler layer, wherein the adhesion layer is formed of titanium, tantalum, titanium tungsten, or manganese nitride.

12. The method for fabricating the semiconductor device of claim 9, further comprising: forming a seed layer positioned between the insulating layer and the filler layer, wherein the seed layer has a thickness between about 10 nm and about 40 nm.

13. The method for fabricating the semiconductor device of claim 1, further comprising: forming a redistribution layer positioned between the active interposer and the first memory die, wherein the active interposer and the first memory die are electrically coupled through the redistribution layer.

14. The method for fabricating the semiconductor device of claim 1, further comprising: forming a second memory die positioned above the first memory die, wherein the first memory die and the second memory die are electrically coupled.

15. The method for fabricating the semiconductor device of claim 1, further comprising: forming a third memory die positioned above the active interposer and positioned adjacent to the first memory die, wherein the third memory die and the active interposer are electrically coupled.

* * * * *